US008794316B2

(12) United States Patent (10) Patent No.: US 8,794,316 B2
Craig (45) Date of Patent: Aug. 5, 2014

(54) REFRACTURE-CANDIDATE EVALUATION AND STIMULATION METHODS

(75) Inventor: David P. Craig, Thornton, CO (US)

(73) Assignee: Halliburton Energy Services, Inc., Houston, TX (US)

( * ) Notice: Subject to any disclaimer, the term of this patent is extended or adjusted under 35 U.S.C. 154(b) by 1008 days.

(21) Appl. No.: 12/061,294

(22) Filed: Apr. 2, 2008

(65) Prior Publication Data

US 2009/0250211 A1 Oct. 8, 2009

(51) Int. Cl.
*E21B 47/00* (2012.01)
*E21B 49/00* (2006.01)
*E21B 43/26* (2006.01)

(52) U.S. Cl.
CPC ............ *E21B 43/26* (2013.01); *E21B 49/008* (2013.01)
USPC .................................................... 166/250.01

(58) Field of Classification Search
USPC .............................. 166/250.1, 250.01; 175/62
See application file for complete search history.

(56) References Cited

U.S. PATENT DOCUMENTS

| 3,285,064 | A | | 11/1966 | Greenkorn et al. |
| 4,797,821 | A | | 1/1989 | Petak et al. |
| 4,828,028 | A | * | 5/1989 | Soliman ..................... 166/250.1 |
| 6,076,046 | A | * | 6/2000 | Vasudevan et al. ............. 702/12 |
| 6,795,773 | B2 | * | 9/2004 | Soliman et al. ................... 702/6 |
| 7,062,420 | B2 | | 6/2006 | Poe |
| 7,272,973 | B2 | | 9/2007 | Craig |
| 7,389,185 | B2 | | 6/2008 | Craig |
| 7,451,812 | B2 | * | 11/2008 | Cooper et al. ............. 166/250.1 |
| 7,516,793 | B2 | * | 4/2009 | Dykstra ..................... 166/308.1 |
| 2005/0216198 | A1 | | 9/2005 | Craig |
| 2005/0222852 | A1 | | 10/2005 | Craig |
| 2007/0272407 | A1 | * | 11/2007 | Lehman et al. ............ 166/250.1 |
| 2007/0294034 | A1 | * | 12/2007 | Bratton et al. .................... 702/6 |
| 2008/0004847 | A1 | * | 1/2008 | Bradford ........................ 703/10 |
| 2010/0191511 | A1 | * | 7/2010 | Hsu et al. .......................... 703/1 |

OTHER PUBLICATIONS

Esphahanian, C. and Storhaug, D.G.: "A Statistical Approach to Pay Identification in the Tight, Fractured, Heterogeneous Reservoirs of the Piceance Basin," paper SPE 38366 presented at the 1997 Rocky Mountain Regional Meeting, Casper, Wyoming, May 18-21, 1997.
Eberhard, M. and Mullen, M.: "The Effect of Completion Methodologies on Production in the Jonah Field," *SPE Production & Facilities* (Aug. 2003) 145.

(Continued)

*Primary Examiner* — Shane Bomar
*Assistant Examiner* — Kipp Wallace
(74) *Attorney, Agent, or Firm* — McDermott Will & Emery LLP; Craig W. Roddy

(57) ABSTRACT

Quantitative refracture diagnostic and fracture-injection/falloff models may be used in methods for oil and gas subsurface formation evaluation techniques. More particularly, such methods may be used to select candidate wells and well candidate layers for stimulation treatments in a subterranean formation. An example of a method for selecting well candidate layers for stimulation treatments in a subterranean formation may comprise the steps of: selecting a candidate well; selecting a reservoir layer to be tested; performing a quantitative refracture-candidate diagnostic test on the reservoir layer; determining at least one reservoir property of the reservoir layer using the quantitative refracture-candidate diagnostic test; and modeling a proposed stimulation treatment using the at least one reservoir property in a reservoir simulation model so as to predict the efficacy of the proposed stimulation treatment.

16 Claims, 14 Drawing Sheets

(56) References Cited

OTHER PUBLICATIONS

Barree, R.D., et al.: "A Practical Guide to Hydraulic Fracture Diagnostic Technologies," paper SPE 77442 presented at the 2002 SPE Annual Technical Conference and Exhibtion, San Antonio, Texas, Sep. 29,-Oct. 2, 2002.

Fisher, K., et al.: "A Comprehensive Study of the Analysis and Economic Benefit of Radioactve Tracer Engineered Stimulation Procedures," paper SPE 30794 presented at the 1995 SPE Annual Technical Conference and Exhibition, Dallas, Texas, Oct. 22-25, 1995.

Griffin, L.G., et al.: "Hydraulic Fracture Mapping of the High-Termpeature, High-Pressure Bossier Sands in East Texas," paper SPE 84489 presented at the 2003 SPE Annual Technical Conference and Exhibition, Denver, Colorado, Oct. 5-8, 2003.

Craig, D.P.: "Analytical Modeling of a Fracture-Injection/Falloff Sequence and the Development of a Refracture-Candidate Diagnostic Test," PhD dissertation, Texas A&M U., College Station, Texas (2005).

Ehlig-Economides, C.A. and Joseph, J.: "A New Test for Determination of Individual Layer Properties in a Multilayered Reservoir," *SPE Formation Evaluation* (Sep. 1987)261.

Jochen, J.E., et al.: "Quantifying Layered Reservoir Properties With a Novel Permeability Test," paper SPE 25864 presented at the 1993 SPE Rocky Mountain Regional/Low Permeability Symposium, Denver, Colorado, Apr. 12-14, 1993.

Hopkins, C.W., et al.: "The Use of Injection/Falloff Tests and Pressure Buildup Tests to Evaluate Fracture Geometry and Post-Stimulation Well Performance in the Devonian Shales," paper SPE 23433 presented at the 1991 SPE Eastern Regional Meeting, Lexington, Kentucky, Oct. 22-25, 1991.

Reeves, S.R.: "Natural Gas Production Enhancement via Restimulation," final report, Contract No. 5097-210-4090, Gas Research Institute, Chicago, Illinois (Jun. 2001).

Huang, H., et al.: "A Short Shut-In Time Testing Method for Determining Stimulation Effectiveness in Low Permeability Gas Reservoirs," *GASTips* (Fall 2000), 6, No. 4, 28, Fall 2000.

Frantz, J.H., Jr., et al.: "Novel Well Testing Procedures Prove Successful in Dakota Formation Infill Program, San Juan Basin," paper SPE 71519 presented at the 2001 SPE Annual Technical Conference and Exhibition, New Orleans, Louisiana, Sep. 30-Oct. 3, 2001.

Craig, D.P., et al.: "Permeability, Pore Pressure, and Leakoff-Type Distributions in Rocky Mountain Basins," *SPE Production & Facilities* (Feb. 2005) 48.

Mayerhofer, M.J. and Economides, M.J.: "Permeability Estimation From Fracture Calibration Treatments," paper SPE 26039 presented at the 1993 Western Regional Meeting, Anchorage, Alaska, May 26-28, 1993.

Mayerhofer, M.J., Ehlig-Economides, C.A., and Economides, M.J.: "Pressure-Transient Analysis of Fracture-Calibration Tests," JPT (Mar. 1995) 229.

Gu, H., et al.: "Formation Permeability Determination Using Impulse-Fracture Injection," paper SPE 25425 presented at the 1993 SPE Production Operations Symposium, Oklahoma City, Oklahoma, Mar. 21-23, 1993.

Abousleiman, Y., Cheng, A. H-D., and Gu, H.: Formation Permeability Determination by Micro or Mini-Hydraulic Fracturing, *J. of Energy Resources Technology* (Jun. 1994) 116, No. 6, 104.

Larsen, L. and Bratvold, R.B.: "Effects of Propagating Fractures on Pressure-Transient Injection and Falloff Data," paper SPE 20580 presented at the 1990 SPE Annual Technical Conference and Exhibition, New Orleans, Louisiana, Sep. 23-26, 1990.

Peres, A.M.M. et al.: "A New General Pressure-Analysis Procedure for Slug Tests," *SPE Formation Evaluation* (Dec. 1993) 292.

Koning, E.J.L. and Niko, H.: "Fractured Water-Injection Wells: A Pressure Falloff Test for Determining Fracturing Dimensions," paper SPE 14458 presented at the 1985 Annual Technical Conference and Exhibition of the Society of Petroleum Engineers, Las Vegas, NV, Sep. 22-25, 1985.

Koning, E.J.L.: "Waterflooding Under Fracturing Conditions," PhD Thesis, Delft Technical University, 1988.

van den Hoek, P.J.: "Pressure Transient Analysis in Fractured Produced Water Injection Wells," paper SPE 77946 presented at the 2002 SPE Asia Pacific Oil & Gas Conference, Melbourne, Australia, Oct. 8-10, 2002.

van den Hoek, P.J.: "A Novel Methodology to Derive the Dimensions and Degree of Containment of Waterflood-Induced Fractures From Pressure Transient Analysis," paper SPE 84289 presented at the 2003 SPE Annual Technical Conference and Exhibition, Denver, Colorado, Oct. 5-8, 2003.

Spivey, J.P. and Lee, W.J.: "Variable Wellbore Storage Models for a Dual-Volume Wellbore," paper SPE 56615 presented at the 1999 SPE Annual Technical Conference and Exhibition, Houston, Texas, Oct. 3-6, 1999.

Cinco-Ley, H. and Samaniego-V., F.: "Transient Pressure Analysis: Finite Conductivity Fracture Case Versus Damage Fracture Case," paper SPE 10179 presented at the 1981 SPE Annual Technical Conference and Exhibition, San Antonio, Texas, Oct. 5-7, 1981.

Valkó, P.P. and Economides, M.J.: "Fluid-Leakoff Delineation in High Permeability Fracturing," *SPE Production & Facilities* (May 1999) 117.

Correa, A.C. and Ramey, H.J., Jr.: "Combined Effects of Shut-In and Production: Solution With a New Inner Boundary Condition," paper SPE 15579 presented at the 1986 SPE Annual Technical Conference and Exhibition, New Orleans, Lousiana, Oct. 5-8, 1986.

Correa, A.C. and Ramey, H.J., Jr.: "A Method for Pressure Buildup Analysis of Drillstem Tests," paper SPE 16802 presented at the 1987 SPE Annual Technical Conference and Exhibition, Dallas, Texas, Sep. 27-30, 1987.

Correa, A.C. and Ramey, H.J., Jr.: "Application of the Unit Step Function to Unusual Well Test Problems," paper SPE 18156 presented at the 1988 SPE Annual Technical Conference and Exhibition, Houston, Texas, Oct. 2-5, 1988.

Ozkan, E. and Raghavan, R.: "New Solutions for Well-Test-Analysis Problems: Part 1—Analytical Considerations," *SPEFE* (Sep. 1991), 359.

Ozkan, E. and Raghavan, R.: "New Solutions for Well-Test-Analysis Problems: Part 2—Computational Considerations and Applications," *SPEFE* (Sep. 1991), 369.

Nolte, K.G.: "Determination of Fracture Parameters From Fracturing Pressure Decline," paper SPE 8341 presented at the 1979 SPE Annual Technical Conference and Exhibition, Dallas, Texas, Sep. 23-25, 1979.

Hagoort, J.: "Waterflood-induced hYdraulic fracturirig," PhD Thesis, Delft Technical, University,1981.

Ozkan, E., Yildiz, T., and Kuchuk, F.J.: "Transient Pressure Behavior of Duallateral Wells," SPE 38760 presented at the 1997 SPE Annual Technical Conference and Exhibition, San Antonio, Texas Oct. 5-8, 1997.

Raghavan, R., Chen, C-C, and Agarwal, B.: "An Analysis of Horizontal Wells Intercepted by Multiple Fractures," SPEJ (Sep. 1997) 235.

Kuchuk, F.J., et al.: "Pressure-Transient Behavior of Horizontal Wells With and Without Gas Cap or Aquifer," *SPE Formation Evaluation* (Mar. 1991) 86.

Wilkinson, D. and Hammond, P.S.: "A Perturbation Method for Mixed Boundary-Value Problems in Pressure Transient Testing," *Transport in Porous Media* (1990) 5, 609-636.

Stehfest, H.:"Numerical Inversion of Laplace Transforms," Communications of the ACM (Jan. 1970), 13, No. 1, 47-49.

Cinco-L., H., Samaniego-V, F., and Dominguez-A, F.: "Transient Pressure Behavior for a Well With a Finite-Conductivity Vertical Fracture," *SPEJ* (Aug. 1978) 253.

Valkó, P.P. and Economidies, M.J.: "Fluid-Leakoff Delineation in High Permeability Fracturing," *SPE Production & Facilities* (May 1999) 117.

Ayoub, J.A., et al.: "Impulse Testing," SPE Formation Evaluation (Sep. 1988) 534.

Ramey, H.J., Jr., Agarwal, R.G., and Martin, I.: "Analysis of 'Slug Test' or DST Flow Period Data," J. Cdn. Pet. Tech. (Jul.-Sep. 1975) 37.

Ramey, H.J., Jr. and Agarwal, R.G.: "Annulus Unloading Rates as Influenced by Wellbore Storage and Skin Effect," SPEJ (Oct. 1972) 453; Trans. AIME, 253.

(56) References Cited

OTHER PUBLICATIONS

Rushing, J.A., et al.: "Analysis of Slug Test Data From Hydraulically Fractured Coalbed Methan Wells," paper SPE 21492 presented at the 1991 SPE Gas Technology Symposium, Houston, Texas Jan. 23-25, 1991.

Ramey, H.J. Jr. and Gringarten, A.C.: "Effect of High Volume Vertical Fractures on Geothermal Steam Well Behavior," Proc., Second United Nations Symposium on the Use and Development of Geothermal Energy, San Francisco, California (May 20-29, 1975).

Xiao, J.J. and Reynolds, A.C.: "A Pseudopressure-Pseudotime Transformation for the Analysis of Gas Well Closed Chamber Tests," paper SPE 25879 presented at the 1993 SPE Rocky Mountain Regional/Low-Permeability Reservoirs Symposium, Denver, Colorado, Apr. 12-14, 1993.

Lee, W.J. and Holditch, S.A.: "Application of Pseudotime to Buildup Test Analysis of Low-Permeability Gas Wells With Long-Duration Wellbore Storage Distortion," JPT (Dec. 1982) 2877.

Meunier, D.F., et al.: "Gas Well Test Analysis: Use of Normalized Pseudovariables," SPEFE (Dec. 1987) 529.

Barree, R.D. and Mukherjee, H.: "Determination of Pressure Dependent Leakoff and its Effect on Fracture Geometry," paper SPE 36424 presented at the 1996 SPE Annual Technical Conference and Exhibition, Denver, Colorado, Oct. 6-9, 1996.

Howard, G.C. and Fast, C.R.: Optimum Fluid Characteristics for Fracture Extension, Drilling and Production Practices (1957), API, 261-270.

Valkó, P. and Economides, M.J.: "Material Balance," Hydraulic Fracture Mechanics, John Wiley & Sons, New York City (1997) Chap. 8, 165-188.

Valkó& P. and Economides, M.J.: "Fracture Height Containment With Continuum Damage Mechanics," paper SPE 26598 presented at the 1993 SPE Annual Technical Conference and Exhibition, Houston, Texas Oct. 3-6, 1993.

Oberhettinger, F.: "Hypergeometric Functions," Handbook of Mathematical Functions, Milton Abramowitz and Irene A. Stegun (eds.), Dover Publications, New York City (1965). Chap. 15, 555-566.

Nolte, K.G.: "A General Analysis of Fracturing Pressure Decline With Application to Three Models," SPEFE (Dec. 1986) 57.

Craig, D.P., Eberhard, M.J., and Barree, R.D.: "Adapting High Permeability Leakoff Analysis Low Permeability Sands for Estimating Reservoir Engineering Parameters," paper SPE 60291 presented at the 2000 SPE Rocky Mountain Regional/Los Permeability Reservoirs Symposium, Denver, Colorado, Mar. 12-15, 2000.

Gringarten, A.C., Ramey, H.J., Jr., Raghavan, R.: "Unsteady-State Pressure Distributions Created by a Well With a Single Infinite-Conductivity Vertical Fracture," SPEJ (Aug. 1974) 347.

Ehlig-Economides, C.A., Fan, Y., and Economides, M.J.: "Interpretation Model for Fracture Calibration Tests in Naturally Fractured Reservoirs," paper SPE 28690 presented at the 1994 SPE International Petroleum Conference and Exhibition of Mexico, Veracruz, Mexico, Oct. 10-13, 1994.

Nolte, K.G.: "Background for After-Closure Analysis of Fracture Calibration Tests," unsolicited paper SPE 39407 available from SPE, Richardson, Texas, Jul. 1997.

Bourdet, D.: "Special Tests" Well Test Analysis: The Use of Advanced Interpretation Models, Elsevier, New York (2002), Chap. 9, 335.

Butler, J.J., Jr.: "The Performance of Slug Tests," The Design, Performance, and Analysis of Slug Tests, Lewis Publishers, Boca Raton (1997), 33.

Kuuskraa, V.A., et al.: "Economic and Technical Rationale for Remediating Inefficiently Producing Eastern Gas Shale and Coalbed Methane Wells," paper SPE 26894 presented at the 1993 SPE Eastern Regional Conference & Exhibition, Pittsburgh, Pennsylvania, Nov. 2-4, 1993.

Hower, T.L. and Decker, M.K.: "Identifying Recompletion Candidates in Stratified Gas Reservoirs," paper SPE 24307 presented at the 1992 SPE Mid-Continent Gas Symposium, Amarillo, Texas, Apr. 13-14, 1992.

Fetkovich, M.J., et al.: "Depletion Performance of Layered Reservoirs Without Crossflow," SPE Formation Evaluation (Sep. 1990) 310.

Fetkovich, M.J.: "Advanced Decline Curve Analysis Identifies Fracture Stimulation Potential," paper SPE 38903 presented at the 1997 SPE Annual Technical Conference and Exhibition, San Antonio, Texas, Oct. 5-8, 1997.

McCoy, T.F., et al.: "Depletion Performance of Poorly Stimulated Layered Reservoirs Without Crossflow," paper SPE 59757 presented at the 2000 SPE/CERI Gas Technology Symposium, Calgary, Alberta, Canada, Apr. 3-5, 2000.

McCain, W.D., et al.: "A Tight Gas Field Study: Carthage (Cotton Valley) Field," paper SPE 26141 presented at the 1993 SPE Gas Technology Symposium, Calgary, Alberta, Canada, Jun. 28-30, 1993.

Voneiff, G. W. and Cipolla, C.: "A New Approach to Large-Scale Infill Evaluations Applied to the OZONA (Canyon) Gas Sands," paper SPE 35203 presented at the 1996 SPE Permian Basin Oil & Gas Recovery Conference, Midland, Texas, Mar. 27-29, 1996.

Mohaghegh, S.: "Performance Drivers in Restimulation of Gas-Storage Wells," SPE Reservoir Evaluation & Engineering (Dec. 2001) 536.

Shelley, F.R.: "Artificial Neural Networks Identify Restimulation Candidates in the Red Oak Field," paper SPE 52190 presented at the 1999 SPE Mid-Continent Operations Symposium, Oklahoma City, Oklahoma, Mar. 28-31, 1999.

Oberwinkler, C. and Economides, M.J.: "The Definitive Identification of Candidate Wells for Refracturing," paper SPE 84211 presented at the 2003 SPE Annual Technical Conference and Exhibition, Denver, Colorado, Oct. 5-8, 2003.

Conway, M.W., et al.: "Expanding Recoverable Reserves Through Refracturing," paper SPE 14376 presented at the 1985 SPE Annual Technical Conference and Exhibition of the Society of Petroleum Engineers, Las Vegas, Nevada, Sep. 22-25, 1985.

Voneiff, G.W., et al.: "The Effects of Unbroken Fracture Fluid on Gas Well Performance," SPE 26664 available from SPE, Richardson, Texas (1994).

Williams, P.: "Value in the Vicksburg," Oil & Gas Investori (Aug. 2004) 24, No. 8, 49.

Williams, P.: "The Barnett Shale," Oil & Gas Investor (Mar. 2002) 22, No. 3, 34.

Williams, P.: "Wattenberg Revival," Oil & Gas Investor (Mar. 1999) 19, No. 3, 22, Mar. 1000.

Moritis, G.: "Diagnosing Underperforming Wells," Oil & Gas Journal (Dec. 4, 2000) 98, No. 49, 23.

Elbel, J.L. and Mack, M.G.: "Refracturing: Observations and Theories," paper SPE 25464 presented at the 1993 SPE Producdtion Operations Symposium, Oklahoma City, Oklahoma, Mar. 21-23, 1993.

Wright, C.A., et al.: "Reorientation of Propped Refracture Treatments in the Lost Hills Field," paper SPE 27896 presented at the 1994 SPE Western Regional Meeting, Long Beach, California, Mar. 23-25, 1994.

Wright, C.A., et al.: "Reorientation of Propped Refracture Treatments," paper SPE 28078 presented at the 1994 SPE/ISRM Rock Mechanics in Petroleum Engineering Conference, Delft, The Netherlands, Aug. 29-31, 1994.

Wright, C.A. and Conant, R.A.: "Hydraulic Fracture Reorientation in Primary and Secondary Recovery from Low-Permeability Reservoirs," paper SPE 30484 presented at the 1995 SPE Annual Technical Conference and Exhibition, Dallas, Texas, Oct. 22-25, 1995.

Siebrits, E., et al.: "Refracture Reorientation Enhances Gas Production in Barnett Shale Tight Gas Wells," Spe 63030 presented at the 2000 SPE Annual Technical Conference and Exhibition, Dallas, Texas, Oct. 1-4, 2000.

Howard, G.C. and Fast, C.R.: "Results of Hydraulic Fracturing," Hydraulic Fracturing, Monograph Series, SPE, Richardson, Texas (1970) 2, 172-176.

Reese, J.L., et al.: "Selecting Economic Refracturing Candidates," paper SPE 28490 presented at the 1994 SPE Annual Technical Conference and Exhibition, New Orleans, Louisiana, Sep. 25-28, 1994.

(56) References Cited

OTHER PUBLICATIONS

Crowell, R.F. and Jennings, A.R.: "A Diagnostic Technique for Restimulation Candidate Selection," paper SPE 7556 prsented at the 1978 SPE Annual Fall Technical Conference and Exhibition, Houston, Texas, Oct. 1-3, 1978.

Kuuskraa, V.A., et al.: "Economic and Technical Rationale for Remediating Inefficiently Producing Eastern Gas Shale and Coalbed Methane Wells," paper SPE 26894 presented at the 1993 SPE Eastern Regional Conference & Exhibition, Pittsburgh, Pennsylvania Nov. 2-4, 1993.

Reeves, S.R., et al.: "Restimulation of Tight Gas Sand Wells in the Rocky Mountain Region," paper SPE 55627 presented at the 1999 SPE Rocky Mountain Regional Meeting, Gillette, Wyoming, May 15-18, 1999.

Reeves, S.R., et al.: "Restimulation Technology for Tight Gas Sand Wells," paper SPE 56482 presented at the 1999 SPE Annual Technical Conference and Exhibition, Houston, Texas, Oct. 3-6, 1999.

Reeves, S. and Wolhart, S.: "Study Looks at Tight-Gas Restimulation Candidate Wells," *Oil & Gas Journal* (Oct. 8, 2001) 99, No. 41, 37.

Cox, D.O., et al.: "Advanced Type Curve Analysis for Low Permeability Gas Reservoirs," paper SPE 35595 prsented at the 1996 SPE Gas Technology Conference, Calgary, Alberta, Canada, Apr. 28-May 1, 1996.

Reeves, S. and Wolhart, S.: "Insights Into Restimulation Candidate Selection," *GasTIPS* (Fall 2001) 7, No. 4, 15, 2001.

Ely, J.W., et al.: "Restimulation Program Finds Success in Enhancing Recoverable Reserves," paper SPE 63241 presented at the 2000 SPE Annual Technical Conference and Exhibition, Dallas, Texas, Oct. 1-4, 2000.

Hopkins, C.W., et al.: "Screening Restimulation Candidates in the Antrim Shale," paper SPE 29172 presented at the 1994 SPE Eastern Regional Conference & Exhibition, Charleston, West Virginia, Nov. 8-10, 1994.

Barree, R.D., Barree, V.L., and Craig, D.P.: "Holistic Fracture Diagnostics," paper SPE 107877 presented at the 2007 SPE Rocky Mountain Oil & Gas Technology Symposium, Denver, Colorado, Apr. 16-18, 2007.

Craig, D. P.: "Analytical Modeling of a Fracture-Injection/Falloff Sequence and the Development of a Refracture-Candidate Diagnostic Test," PhD dissertation, Texas A&M U., College Station, Texas (2006).

Craig, D.P. and Blasingame, T.A.: "A New Refracture-Candidate Diagnostic Test Determines Reservoir Properties and Identifies Existing Conductive or Damaged Fractures," SPE 96785 presented at the 2005 SPE Annual Technical Conference and Exhibition, Dallas, Texas, Oct. 9-12, 2005.

Boone. T.J.: "Exploiting poroelastic effects and permeability contrasts to control fracture orientation," SPE 28087 presented at the SPE/ISRM Rock Mechanics in Petroleum Engineering Conference held in Delft, The Netherlands, Aug. 29-31, 1994.

International Search Report and Written Opinion for PCT/GB2006/003658 dated Oct. 2, 2006.

\* cited by examiner ns and more
REFRACTURE-CANDIDATE EVALUATION AND STIMULATION METHODS

BACKGROUND

The present invention relates to the field of oil and gas subsurface earth formation evaluation techniques and more particularly, to methods for selecting well candidate layers for stimulation treatments in a subterranean formation.

Oil and gas hydrocarbons may occupy pore spaces in subterranean formations such as, for example, in sandstone earth formations. The pore spaces are often interconnected and have a certain permeability, which is a measure of the ability of the rock to transmit fluid flow. Stimulation treatment operations such as, hydraulic fracturing or acid stimulation may be performed to increase the production from a wellbore if the near-wellbore permeability is low or when damage has occurred to the near-wellbore area.

Hydraulic fracturing is a process by which a fluid under high pressure is injected into the formation to create and/or enhance fractures that penetrate into the subterranean formation. These fractures can create flow channels to improve the near term productivity of the well. Propping agents of various kinds, chemical or physical, are often used to hold the fractures open and to prevent the healing of the fractures after the fracturing pressure is released.

Stimulation treatments may encounter a variety of problems during stimulation operations resulting in a less than optimal stimulation treatment. Accordingly, after a stimulation treatment, it may be desirable to evaluate the effectiveness of the stimulation treatment performed or to provide a baseline of reservoir properties for later comparison and evaluation. One example of a problem occasionally encountered in fracturing treatments for example is bypassed layers. That is, during an original completion, oil or gas wells may contain layers bypassed either intentionally or inadvertently. Additionally, over time, the effectiveness of stimulation treatments may decrease, resulting in portions of subterranean formations becoming less productive. Fines migration is an example of one way in which stimulation treatments can lose their effectiveness over time. Migration of fines may cause particles suspended in the produced fluid to bridge the pore throats near the wellbore so as to reduce well productivity.

When considering stimulation treatments or restimulation treatments for a number of wells or a number of subterranean layers in a well, it is desirable to choose the wells and/or layers to be treated in an economically optimal fashion. Often, it may not be economically feasible or advisable to perform stimulation treatments on all wells and/or on all layers of each well. Thus, operators will often attempt to select a subset of wells and/or layers to stimulate. Choosing the best candidates for stimulation treatments has been attempted by a variety of methods.

To select the best candidate for stimulation or restimulation, there are many parameters to be considered. Some important parameters for hydraulic fracturing may include, for example, formation permeability, in-situ stress distribution, reservoir fluid viscosity, skin factor, effective fracture half-length, fracture conductivity, and reservoir pressure. Various methods have been developed to estimate formation properties and thereby to use these estimated properties to evaluate the effectiveness of previous stimulation treatments. Once formation properties are estimated for given wells and/or layers, these formation properties may be used to select wells or layers to be stimulated. Additionally, these estimated formation properties may be used to develop stimulation treatments suited for the selected wells and/or layers.

Numerous methods have been developed to select well candidates for stimulation. One example of a conventional method for selecting stimulation candidates includes artificial neural network programs that can be "trained" with a set of input and output parameters. Training implies that the neural network develops a relationship between a given set of input and output parameters. After training, the neural network is used as a predictive tool to identify stimulation candidates. Virtual intelligence may be used by training an artificial neural network with production, completion and fracturing variables that include fracturing fluid type, breaker type, and breaker concentration, etc. After training, the artificial neural network may be used to identify stimulation candidate wells with relatively poor fracture treatment design or poor execution by comparing predicted and actual well performance.

Another method of identifying and selecting well candidates for stimulation uses production statistics or moving domain analysis implemented on a computer. This method compares production indicators of each well with its offsets to identify well underperformance. By comparing a well's production with only the immediate offset well production, the variability of reservoir quality may be minimized in the comparison.

Still another conventional method uses production type-curve analysis. Production type-curve analysis requires history matching well production using analytical type-curves developed specifically for single layer hydraulically fractured low permeability gas wells. Restimulation candidates may be identified by a short effective fracture half-length and the production increase potential of extending the effective fracture half-length with a restimulation treatment.

Unfortunately, these methods suffer a variety of drawbacks including the disadvantage that they evaluate the restimulation potential of each well and not individual layers in a multilevel completion. That is, these conventional methods evaluate well performance as opposed to identifying bypassed layers that could be at or near virgin reservoir pressure. Additionally, these methods may be suited to selecting and developing stimulation treatments for wells but lack cost-effective methods for selecting and developing stimulation treatment for individual layers in a multilayer completion. Additionally, conventional methods may lack the degree of accuracy desired for estimating reservoir properties that may be desired to select candidates for stimulation treatments.

SUMMARY

The present invention relates to the field of oil and gas subsurface earth formation evaluation techniques and more particularly, to methods and an apparatus for determining reservoir properties of subterranean formations using quantitative refracture-candidate diagnostic test methods.

An example of a method for selecting well candidate layers for stimulation treatments in a subterranean formation may comprise the steps of: selecting a candidate well; selecting a reservoir layer to be tested; performing a quantitative refracture-candidate diagnostic test on the reservoir layer; determining at least one reservoir property of the reservoir layer using the quantitative refracture-candidate diagnostic test; and modeling a proposed stimulation treatment using the at least one reservoir property in a reservoir simulation model so as to predict the efficacy of the proposed stimulation treatment.

Another example of a method for selecting well candidate layers for stimulation treatments in a subterranean formation may comprise the steps of: selecting a candidate well; selecting a reservoir layer to be tested; performing a quantitative refracture-candidate diagnostic test on the reservoir layer; determining at least one reservoir property of the reservoir layer using the fracture-injection/falloff test; and modeling a proposed stimulation treatment using the at least one reservoir property in a reservoir simulation model so as to predict the efficacy of the proposed stimulation treatment.

An example of a computer program, stored on a tangible storage medium, for evaluating refracture efficacy of at least one reservoir layer in a subterranean formation, the program may comprise executable instructions that cause a computer to: determine at least one reservoir property of the reservoir layer using a quantitative refracture-candidate diagnostic model; and model a proposed stimulation treatment using the at least one reservoir property in a reservoir simulation model so as to predict the efficacy of the proposed stimulation treatment.

The features and advantages of the present invention will be apparent to those skilled in the art. While numerous changes may be made by those skilled in the art, such changes are within the spirit of the invention.

BRIEF DESCRIPTION OF THE DRAWINGS

These drawings illustrate certain aspects of some of the embodiments of the present invention and should not be used to limit or define the invention.

DESCRIPTION OF PREFERRED EMBODIMENTS

Figure 1:
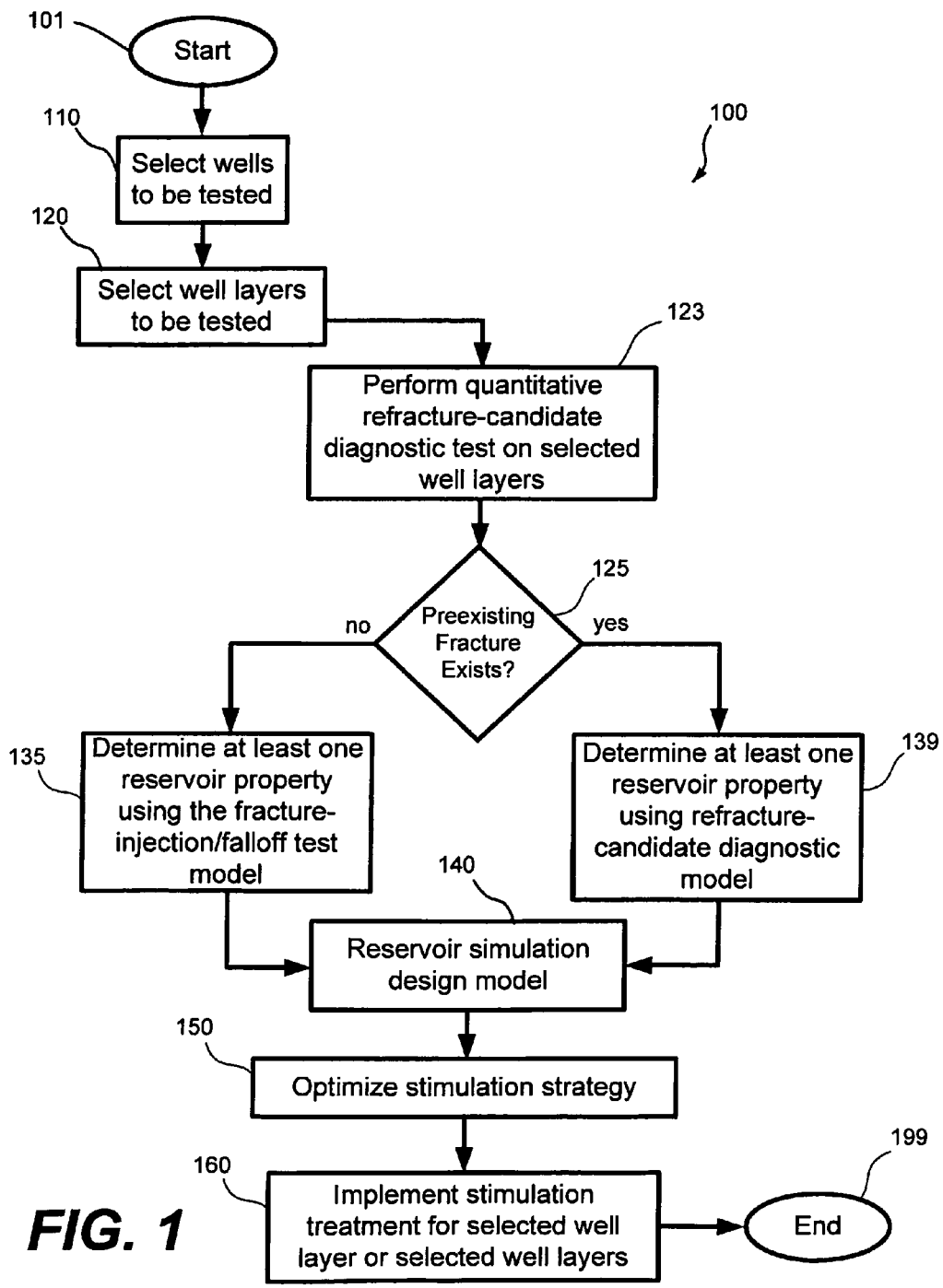
FIG. 1 is a flow chart illustrating an example of one implementation of a method for selecting well candidate layers for stimulation treatments in a subterranean formation.

The present invention relates to the field of oil and gas subsurface earth formation evaluation techniques and, more particularly, to methods for selecting well example layers for stimulation treatments in a subterranean formation.

Methods of the present invention may be useful for selecting well candidate layers for stimulation treatments using, in part, quantitative refracture-candidate diagnostic test methods and/or fracture-injection/falloff test methods. Fracture-injection/falloff test methods and quantitative refracture-candidate diagnostic tests may use injection fluids at pressures exceeding the formation fracture initiation and propagation pressure. Fracture/injection falloff test methods models and tests are described in U.S. Pat. No. 7,272,973, entitled, "Methods and Systems for Determining Reservoir Properties of Subterranean Formations" which is incorporated by reference in its entirety herein for all purposes. Quantitative refracture-candidate diagnostic models and tests are described in U.S. Patent Publication No. 2007/0083331, entitled, "Methods and Systems for Determining Reservoir Properties of Subterranean Formations with Pre-Existing Fractures" which is incorporated by reference in its entirety herein for all purposes.

The term, "refracture-candidate diagnostic test," as used herein refers to the computational estimates shown in Sections I and II of U.S. Patent Publication 2007/0083331 used to estimate certain reservoir properties, including the transmissibility of a formation layer or multiple layers. The test recognizes that an existing fracture retaining residual width has associated storage, and a new induced fracture creates additional storage. Consequently, a fracture-injection/falloff test in a layer with a pre-existing fracture will exhibit characteristic variable storage during the pressure falloff period, and the change in storage is observed at hydraulic fracture closure. In essence, the test induces a fracture to rapidly identify a pre-existing fracture retaining residual width.

Generally, methods of the present invention may permit the selection of one or more well candidates for stimulation from a number of wells. Alternatively, methods of the present invention may permit the selection of one or more candidate reservoir layers for stimulation from within a particular well. To accomplish the selection of candidate reservoir layers or well candidates, the methods herein may use certain quantitative models to estimate one or more reservoir properties of a reservoir layer. In particular, fracture-injection/falloff tests, and/or quantitative refracture-candidate diagnostic tests may be performed on each layer as desired to quantitatively estimate one or more of these reservoir properties. The reservoir property estimate may then be used in a reservoir simulator to estimate the efficacy of a proposed stimulation treatment. If desired, the reservoir simulator may be executed iteratively with varying proposed stimulation treatments until a desired set of criteria is met.

An example of one implementation of a method of the present invention is illustrated generally in FIG. 1. Method 100 begins generally at step 101. Candidate wells may be chosen for evaluation and testing in step 110. Any number of methods may be used to select candidate wells to be evaluated including arbitrarily selecting a subset of wells to be tested or simply selecting all of the available wells to be tested. Methods that could be used to narrow the number of available wells to be tested include methods such as production data analysis, well file review, fracture imaging during earlier stimulation operations, production logging, statistical field studies and/or an artificial neural network.

Well file review suggests identifying candidate wells by examining the initial completion operations and identifying poor stimulation treatment design, poor stimulation treatment execution, or less than optimal completion design.

Production data analysis may be as simple as comparing a well's production with its nearest offset producers. Or, production data analysis may be complicated, requiring sophisticated multilayer models used to history-match well production and layer production to production logs and including various types of measurement techniques (like flow meters or temperature changes) to interpret layer production rate.

Statistical field studies evaluate well production versus offset wells and the well completion technique versus offsets using field-wide statistical comparisons or smaller localized statistical comparisons. Virtual intelligence may be used to train an artificial neural network to recognize candidates using production or completion data.

During the initial or primary stimulation operations, near wellbore or far-field fracture imaging techniques might have been used to evaluate treatment placement. Near wellbore methods include temperature logging and radioactive tracing/post treatment logging, while far-field methods include tiltmeter or microseismic imaging. Candidate wells can be selected from the analysis of imaging data by identifying poor treatment placement or ineffective diversion.

After selecting candidate wells in step 110, candidate reservoir layers of each well may be selected for evaluation and testing in step 120. Any number of methods may be used to select candidate layers to be evaluated, including arbitrarily choosing a subset of layers to be tested or simply selecting all of the available wells to be tested. Methods that could be used to narrow the number of available layers to be tested include methods such as production data analysis, production logging, or fracture imaging during earlier stimulation operations.

Production data analysis can reveal layers that appear to be ineffectively stimulated based on a history match of the well production and layer producing rate. Production logging may be used in conjunction with production data analysis or as an independent method to identify layers targeted for restimulation evaluation. The layers targeted can be the best producing layers or the worst, depending on the objectives of the restimulation program. Fracturing imaging may also identify layers bypassed or ineffectively stimulated during previous stimulation treatments.

Once the candidate layers to be tested are chosen for evaluation in step 120, a fracture-injection/falloff test, or a quantitative refracture-candidate diagnostic test, may be performed on each layer as desired. These quantitative diagnostic tests are described in detail in U.S. Pat. No. 7,272,973 and U.S. Patent Publication No. 2007/0083331. The refracture-candidate diagnostic test can identify a pre-existing conductive fracture, and quantify a pre-existing fracture half-length, a pre-existing fracture conductivity, and pre-existing fracture damage.

Alternatively, instead of performing the quantitative diagnostic tests on each layer individually, the quantitative fracture-injection/falloff tests and/or quantitative refracture-candidate diagnostic tests may be performed on multiple layers grouped together. Grouping of layers for testing, however, may introduce additional computational uncertainty into the transmissibility estimates.

In step 125, if a pre-existing fracture exists, the quantitative refracture-candidate diagnostic model and test may be used to estimate the conductivity of the fracture and whether the fracture is damaged (i.e., choked fracture skin) as described in U.S. Patent Publication No. 2007/0083331. If no pre-existing fracture exists, then method 100 follows the interpretation of the fracture-injection/falloff test model of step 135. Otherwise, method 100 continues to step 139 using the refracture-candidate diagnostic model.

In steps 135 and 139, formation properties may be quantitatively estimated using these models and test methods. Formation properties that may be quantitatively estimated include closure stress, pre-existing fracture half-length, pre-existing fracture conductivity, pre-existing fracture damage, transmissibility of the formation layer, and reservoir pressure.

After estimating one or more reservoir properties of each reservoir layer in steps 135 or 139, the one or more reservoir properties may then be used as inputs in a reservoir simulation design model in step 140. The reservoir simulation design model in step 140 may predict how a proposed stimulation treatment would perform given the estimated reservoir properties and any desired criteria or constraints. Any number of simulation design models may be used to predict how a proposed stimulation treatment would perform including methods such as, analytical two-dimensional fracture models or numerical three-dimensional fracture models. Typically, two-dimensional models estimate two fracture dimensions, for example, fracture half-length and width, and, when one dimension is specified, fracture height based on the input parameters including fracture treatment fluid, proppant, injection rate, and volume. Three-dimensional planar models provide estimates of fracture half-length, width, height and conductivity for a given treatment fluid, proppant, injection rate, and volume. Non-planar models could also potentially be used to infer created fracture geometry for a given treatment fluid, proppant, injection rate, and volume.

If desired, a reservoir simulation model may optionally be executed iteratively with varying proposed stimulation treatments until a desired set of criteria is met, as in step 150. In certain embodiments, it may be desired to achieve an optimal stimulation of one or more reservoir layers. In other embodiments, other criteria such as cost may be considered when choosing an optimal treatment. For example, a given operator may wish to determine the most optimal stimulation treatment that may be achieved for a given fixed cost. Alternatively, an operator may wish to use other economic criteria, like maximizing the net present value of a restimulation treatment to optimize restimulation treatment design.

The stimulation strategy developed in step 150 may optionally be implemented in step 160. Restimulation can include refracturing or other stimulation methods, such as remedial chemical treatments for removing fracture damage or acid stimulation treatments.

One or more methods of the present invention may be implemented via an information handling system. For purposes of this disclosure, an information handling system may include any instrumentuality or aggregate of instrumentalities operable to compute, classify, process, transmit, receive, retrieve, originate, switch, store, display, manifest, detect, record, reproduce, handle or utilize any form of information, intelligence or data for business, scientific, control or other purposes. For example, an information handling system may be a personal computer, a network storage device, or any other suitable device and may vary in size, shape, performance, functionality and price. The information handling system may include random access memory (RAM), one or more processing resources such as a central processing unit (CPU or processor) or hardware or software control logic, ROM and/or other types of nonvolatile memory. Additional components of the information handling system may include one or more disk drives, one or more network ports for communication with external devices as well as various input and output (I/O) devices, such as a keyboard, a mouse and a video display. The information handling system may also include one or more buses operable to transmit communications between the various hardware components.

To facilitate a better understanding of the present invention, the following examples of certain aspects of some embodiments are given. In no way should the following examples be read to limit, or define, the scope of the invention.

EXAMPLES

Field Example

An example well was chosen for evaluation and testing by reviewing microseismic fracture imaging. For example, the example well was stimulated with three fracture treatments targeting 16 sands, and the fractures were mapped using microseismic imaging. The fracture mapping suggests that 4 of 16, or 25%, of the sands targeted were bypassed or ineffectively stimulated.

Figure 2:
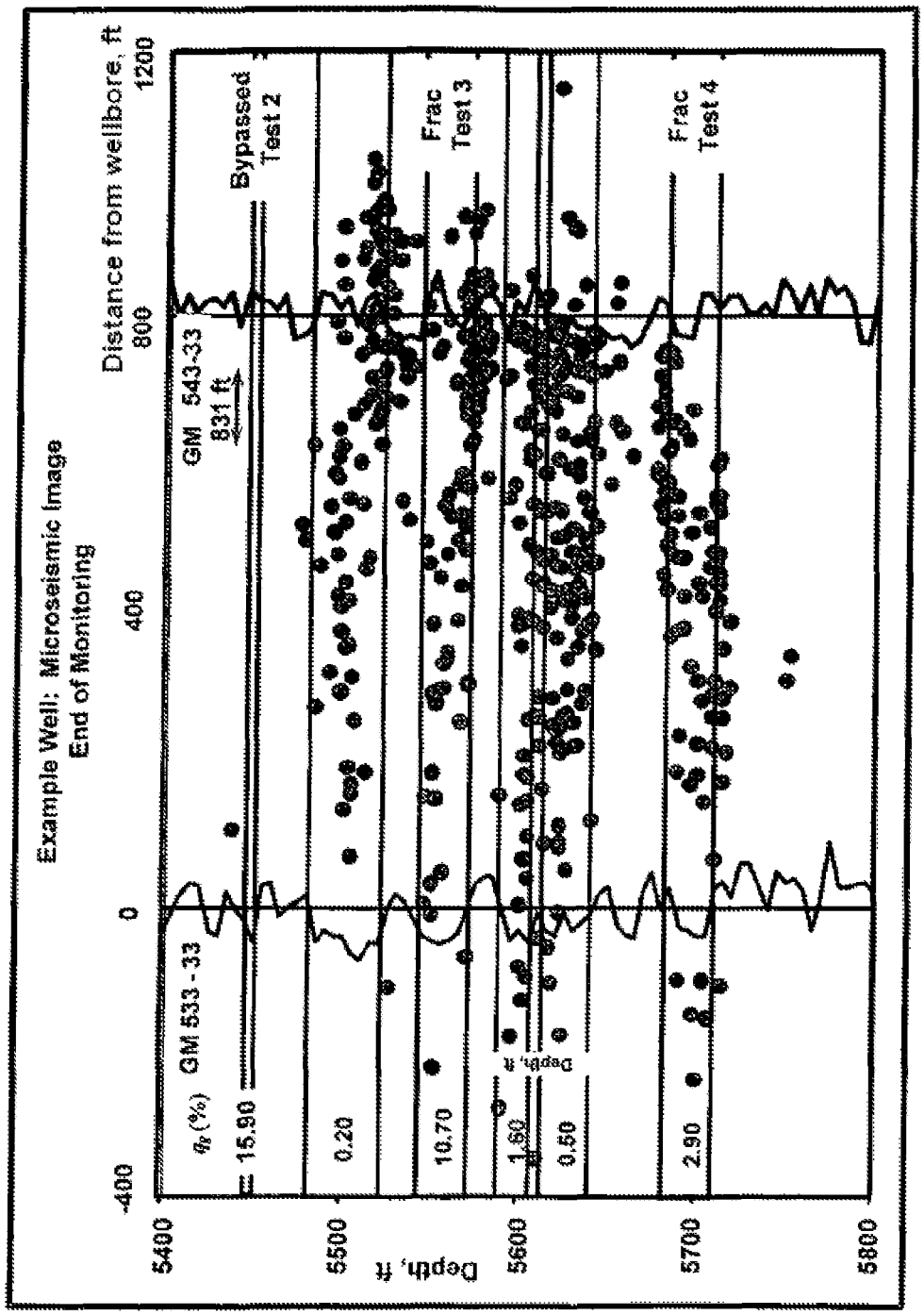
FIG. 2 is a fracture treatment microseismic map of events after monitoring a first fracture treatment of an example well in a field example.

FIG. 2 shows the microseismic events mapped at the end of monitoring a first fracture treatment, which targeted six sands using a limited-entry fracture design technique. Sands perforated at 5,487 ft, 5,557 ft, 5,598 ft, 5,629 ft, and 5,700 ft appear to have been effectively stimulated based on numerous seismic events recorded in each layer. Conversely, the sand perforated at 5,450 ft does not appear to have been stimulated with only a single microseismic event recorded and mapped above the top of the sand.

Figure 3:
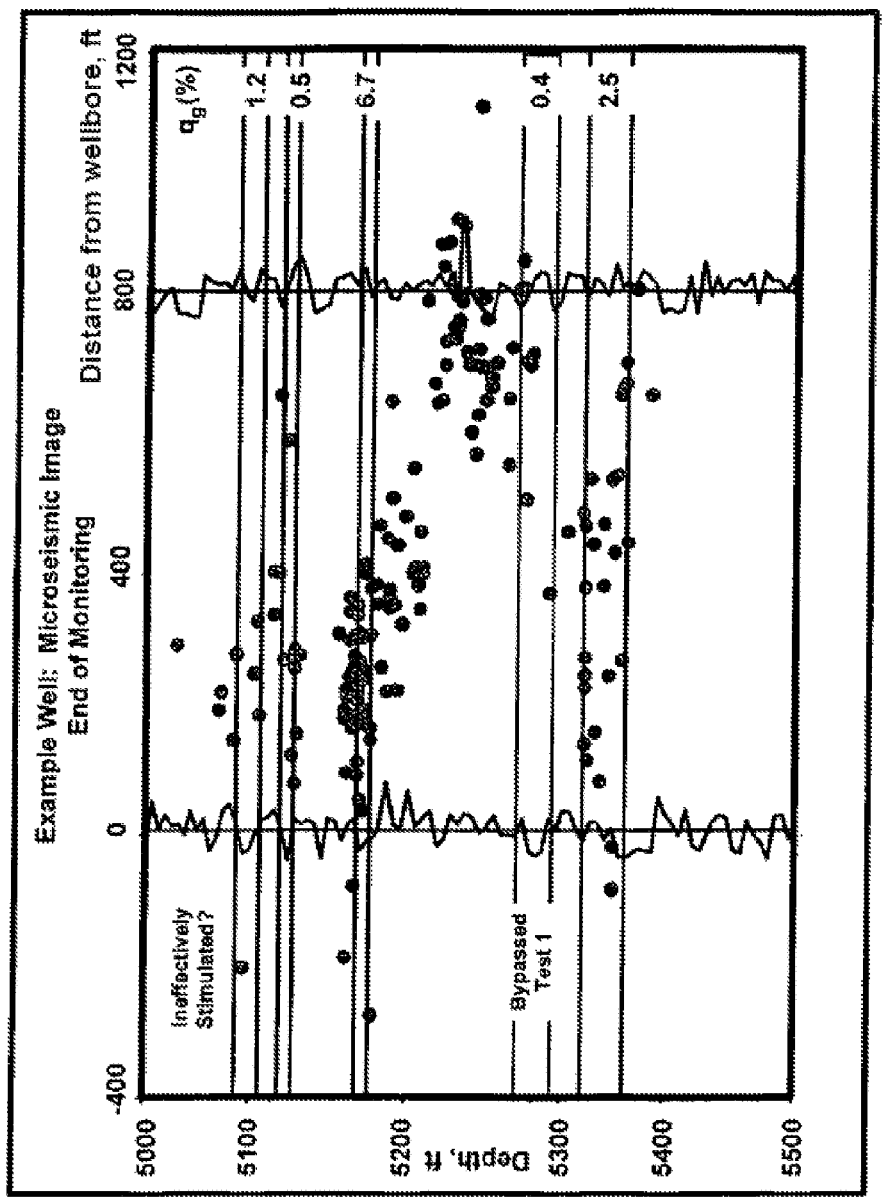
FIG. 3 is a fracture treatment microseismic map of events after monitoring a second fracture treatment of an example well.

FIG. 3 shows the microseismic events mapped at the end of monitoring a second fracture treatment, which targeted five sands using a limited-entry fracture design technique. Sands perforated at 5,110 ft, 5,165 ft, and 5,350 ft appear to have been stimulated based on numerous seismic events recorded in each layer. The interpretation of the microseismic map in the layer perforated at 5,081 ft is ambiguous with respect to stimulation effectiveness since only a few events are mapped in the layer and none are within 100 ft of the wellbore. The sand perforated at 5,278 ft does not appear to have been stimulated as no near-wellbore microseismic events are mapped, although a few events are mapped about 550 ft from the wellbore and might be in the targeted layer.

FIGS. 2 and 3 also show an interpretation of the example well production log recorded after 62 days of production. In FIGS. 2 and 3, the layer flow rate, $q_g$, is expressed as a percentage of the total well production during logging. For example, the sand perforated at 5,700 ft is producing 2.90% of the total well production. It is notable that layers with numerous mapped microseismic events have a broad range of producing rates; that is, the rates vary from 0.20% to 10.70% of the total well production. The production rate from layers without any or with only a few mapped microseismic events range from 0.40% to 15.90% of the total production. Consequently, if the microseismic images are correct, production logging may not be a reliable method for identifying bypassed or ineffectively stimulated pay. Other diagnostic techniques in combination with production logging may be required to identify layers for restimulation.

Based on the microseismic maps shown in FIGS. 2 and 3, it would be relatively simple to re-enter the well and refracture the sands perforated at 5,278 ft and 5,450 ft and to evaluate the incremental production obtained. However, as there are hundreds of wells without fracture imaging, short-term pressure-transient testing and a new nitrogen fracture-injection/falloff test can be used as refracture-candidate diagnostics for identifying and evaluating layers for restimulation.

Layers perforated at 5,557 ft and 5,700 ft appear to be effectively stimulated based on numerous mapped microseismic events. Layers perforated at 5,278 ft and 5,450 ft may have been bypassed or ineffectively stimulated based on the lack of mapped microseismic events. A refracture-candidate diagnostic preferably should be able to differentiate between a layer with or without an existing fracture and at least qualitatively determine if the fracture is damaged.

Figure 4:
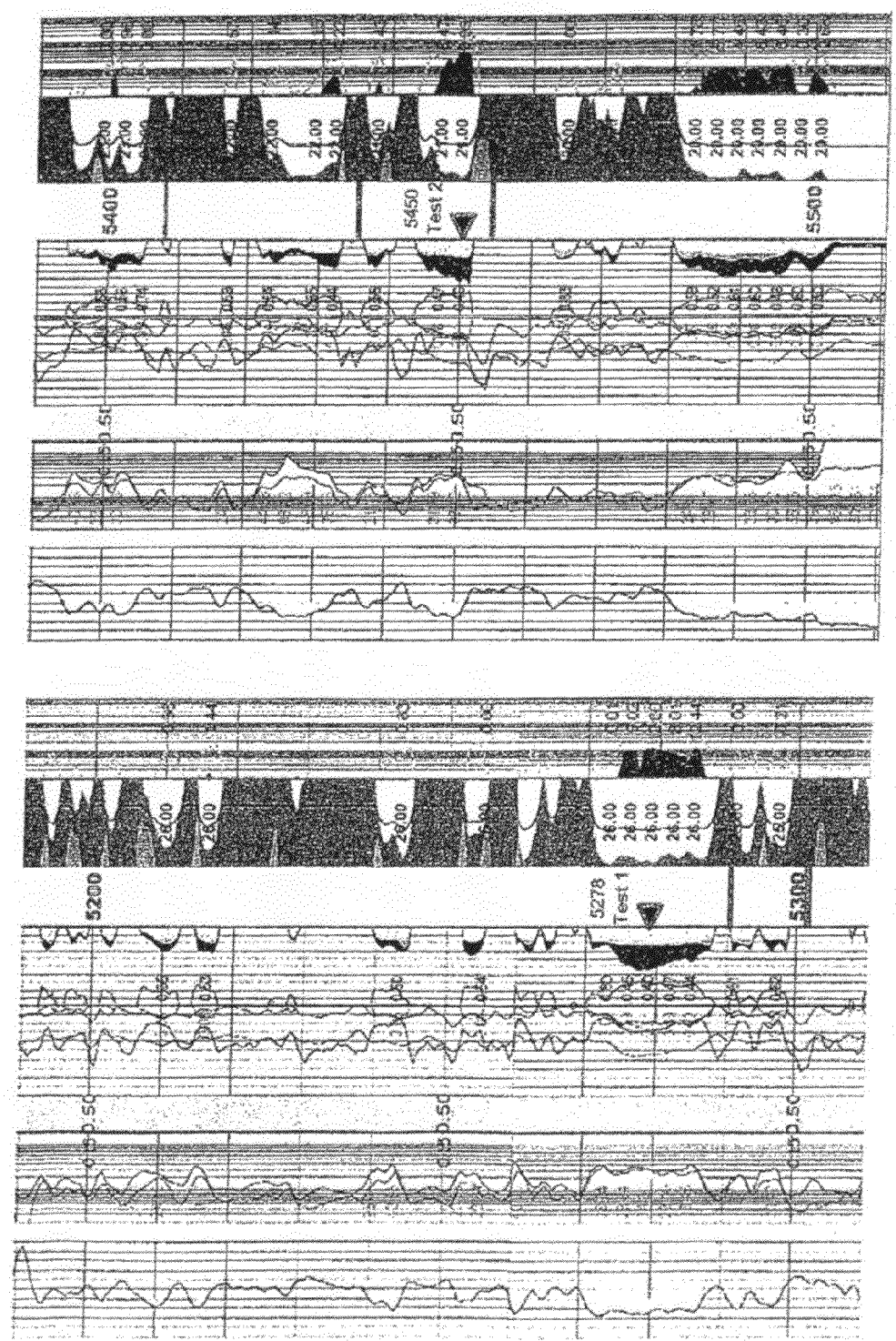
FIG. 4 shows an example of the openhole log sections, with bypassed layers, for sands perforated in an example well.
Figure 5A:
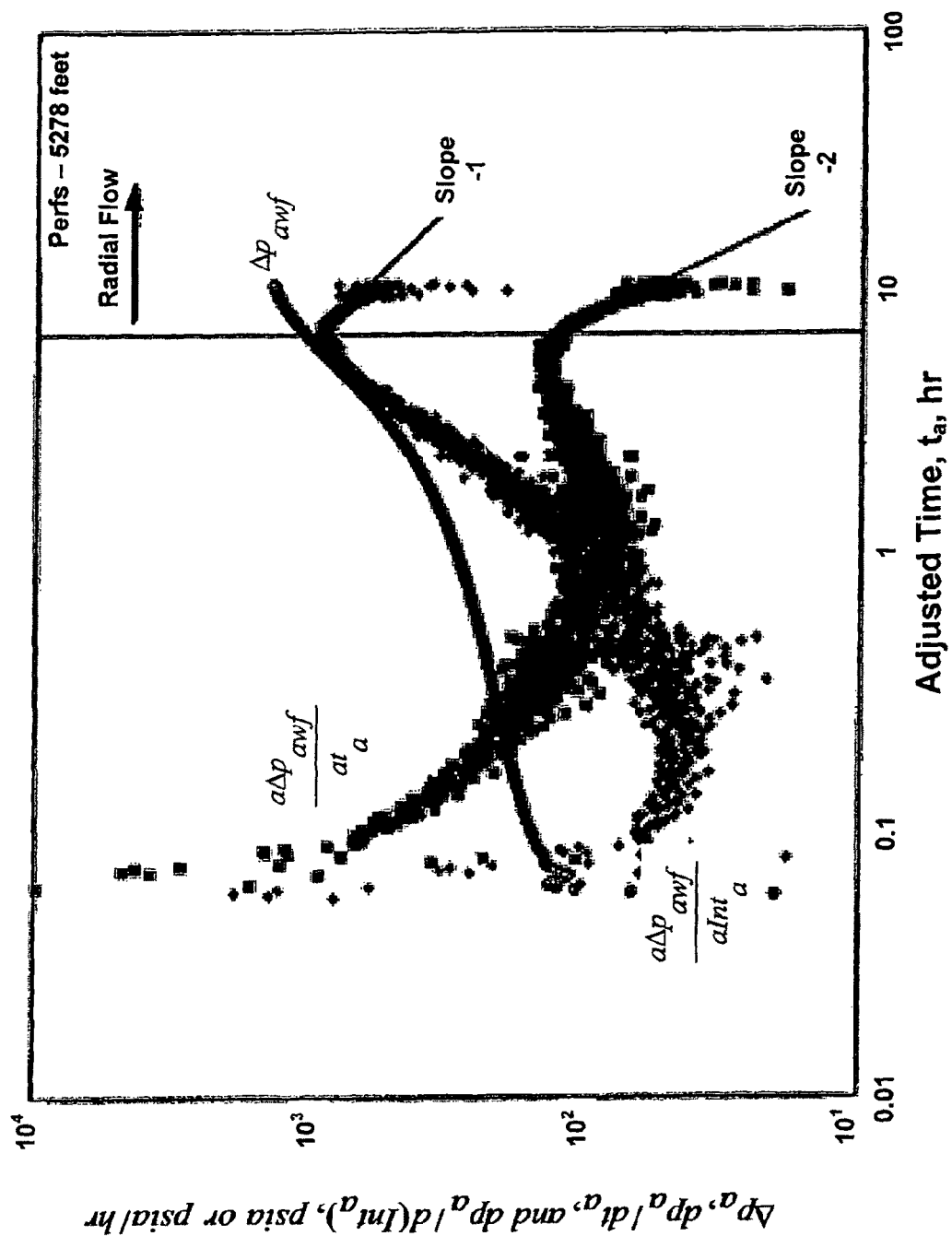
FIG. 5A shows an example of the pre-fracture fracture-injection/falloff analysis for an example well.
Figure 5B:
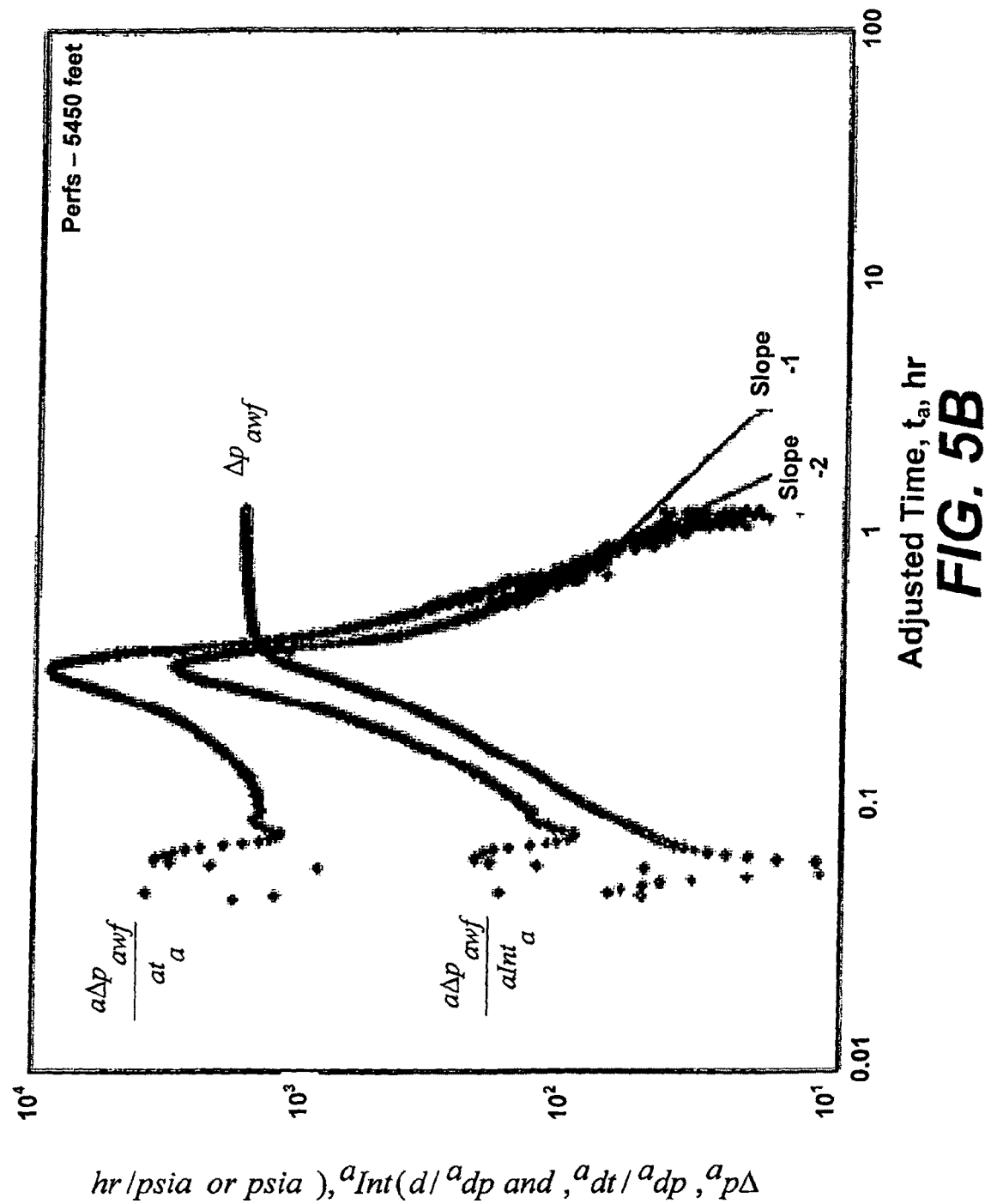
FIG. 5B shows an example of the pre-fracture fracture-injection/falloff analysis for an example well.
Figure 5C:
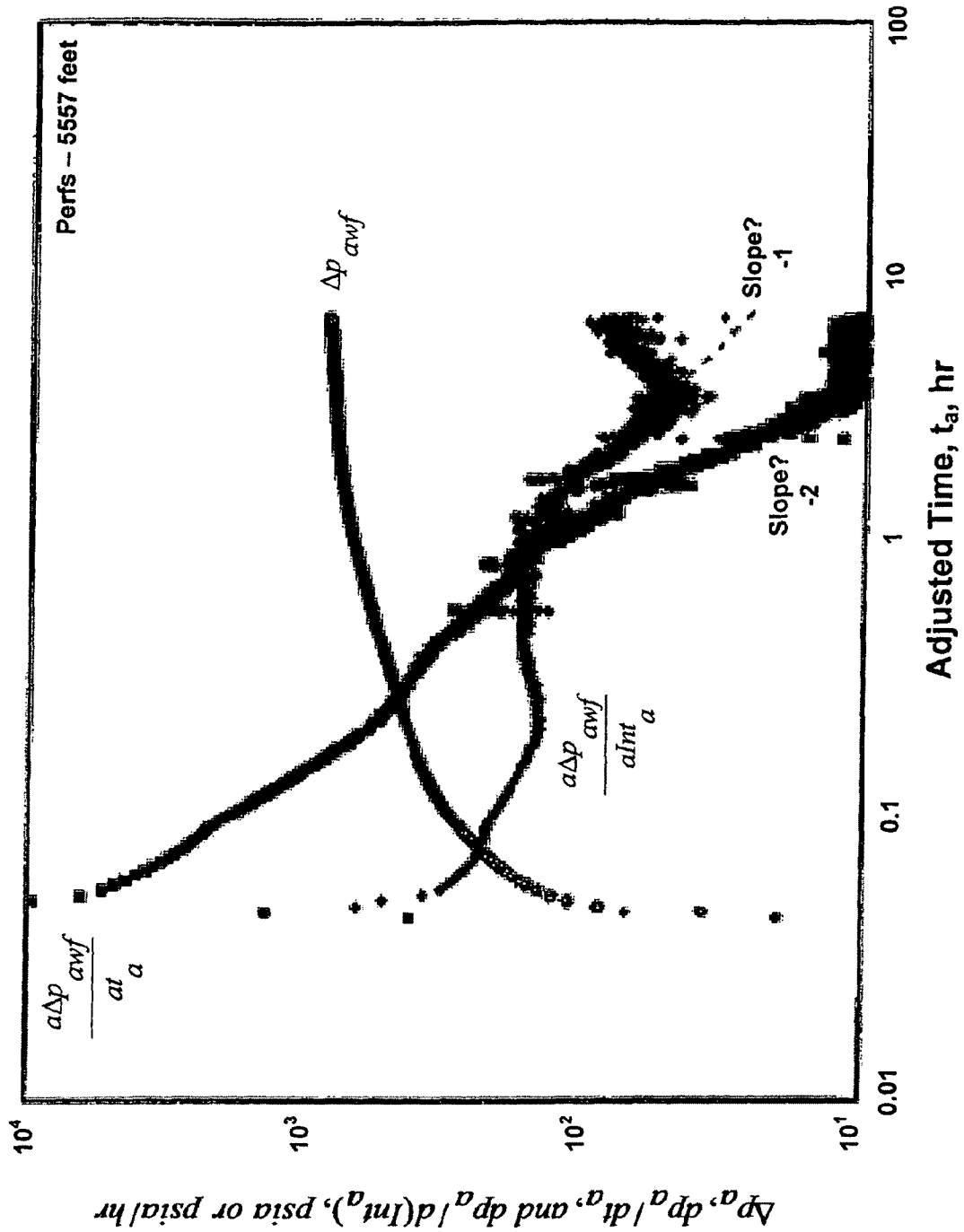
FIG. 5C shows an example of the pre-fracture fracture-injection/falloff analysis for an example well.
Figure 5D:
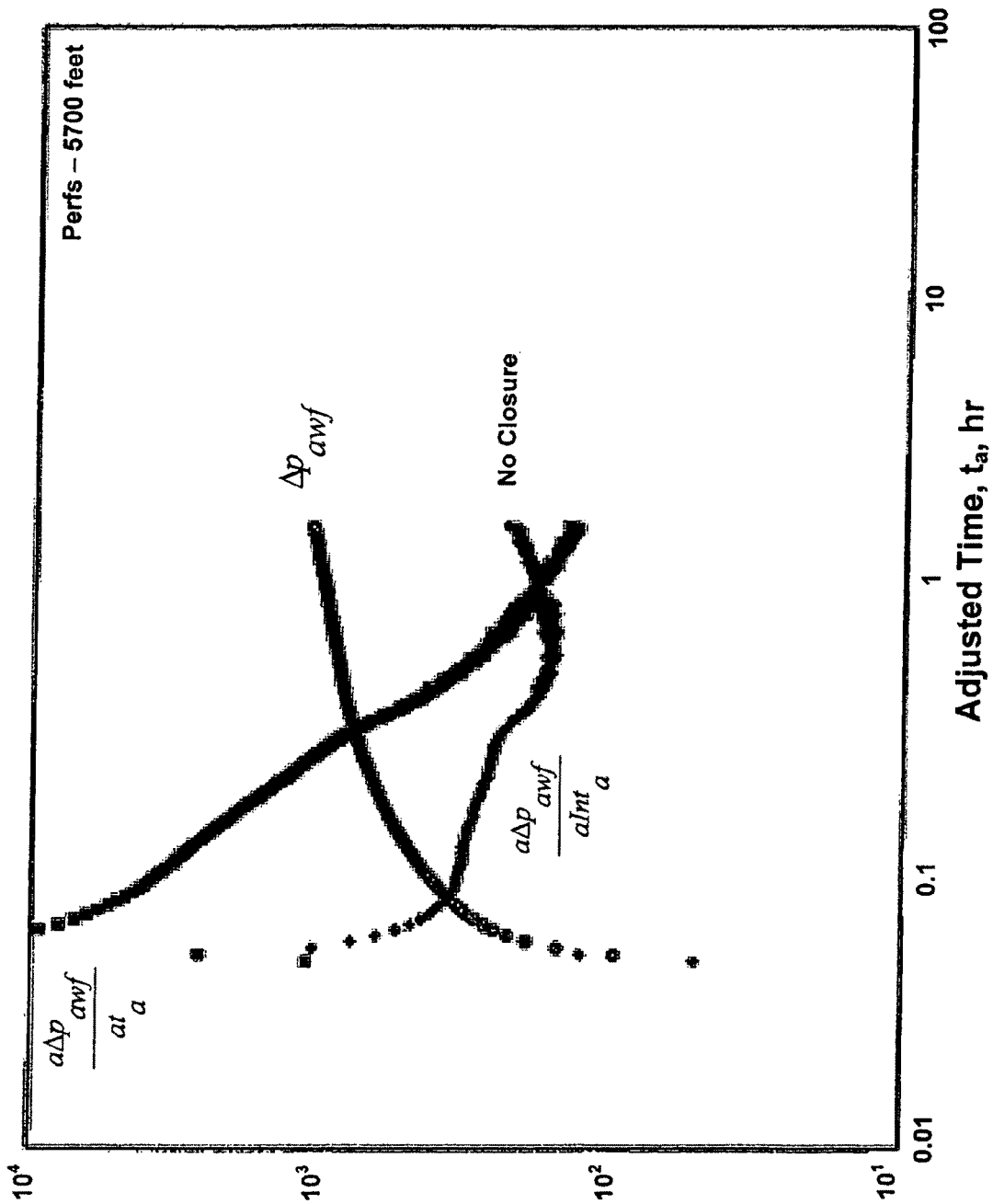
FIG. 5D shows an example of the pre-fracture fracture-injection/falloff analysis for an example well.

FIG. 4 shows the openhole log sections for the sands perforated at 5,278 ft and 5,450 ft which appear to be bypassed or ineffectively stimulated. The production log interpretation in FIGS. 2 and 3 suggest that the 18 ft sand perforated at 5,278 ft is producing only 0.40% of the well total, but, as shown in FIG. 3, the 8 ft sand perforated at 5,450 ft is producing 15.90% of the well total.

The following services/tests were performed during the example well workover operations.

Four pressure buildup tests were attempted in isolated layers perforated at 5,700-01 ft, 5,557-58 ft, 5,450-51 ft, and 5,278-79 ft. Pressure buildups began with the deepest layer and progressed uphole over several days. All zones above the isolated layer were continuously produced up the annulus.

Recorded a new production log.

Nitrogen fracture-injection/falloff tests were pumped in isolated layers perforated at 5,278-79 ft, 5,450-51 ft, 5,557-58 ft, and 5,700-01 ft.

Pre-Fracture Fracture-Injection/Falloff Testing. As previously noted and as shown in FIG. 2, the sand perforated at 5,450 feet was producing 15.9% of the well total. Yet, the microseismic image indicates the layer was inadvertently bypassed during fracturing. 500-gallon diagnostic fracture-injection/falloff tests were pumped in each isolated layer to determine initial reservoir pressure and estimate permeability.

FIG. 5 shows log-log graphs of $\Delta p_{awf}$ vs. $t_a$, $d\Delta p_{waf}/dt_a$ vs. $t_a$, and $d\Delta p_{awf}/d(\ln t_a)$ vs. $t_a$, as disclosed in Barree, R. D., et al., *Holistic Fracture Diagnostics*, SPE 107877 (2007). Table 1 contains pore pressure and permeability estimates. The lowest permeability corresponds to the layer perforated at 5,700 ft, which, as shown in FIG. 5, did not have fracture closure during a 2-hour shut-in period, and before-closure pressure-transient analysis was the only applicable analysis method to estimate permeability. For the layer perforated at 5,278 ft, pseudoradial flow was observed after about 9 hours of shut-in following the treated water injection, and for the layer perforated at 5,557 ft, pseudoradial flow was observed after about 2 hours of shut-in. However, after a negative unit slope indicative of pseudoradial flow was observed, the semilog derivative, $d\Delta p_{awf}/d(\ln t_a)$, begins to increase, which suggests "closure" is occurring. The observed semilog derivative data may possibly be explained by layering; that is, the falloff is influenced by layers of different permeability and pressure. The permeability for the layer perforated at 5,557 ft was calculated assuming the final recorded data are the beginning of a pseudoradial flow period. The quickest transition to pseudoradial flow occurs for the sand perforated at 5,450 ft, which as shown in Table 1 has a calculated permeability of 1.0 md and is surrounded by microdarcy sandstones.

TABLE 1

Example well pre-fracture fracture-injection/falloff analysis.

| Perforation Depth (ft) | Initial Pressure (psia) | Permeability (md) |
|---|---|---|
| 5278 | 2365 | 0.011 |
| 5450 | 2645 | 1.000 |
| 5557 | 2400 | 0.022 |
| 5700 | 2200* | 0.001* |

*Estimated from before-closure data.

Production Log. An initial production log was recorded after 62 days of production when the well was producing in excess of 1,000 Mscf/D, and the results are shown with the microseismic map in FIGS. 2 and 3. As previously noted, the production log results and microseismic map are contradictory assuming reservoir quality does not vary. A new production log was recorded prior to beginning the isolated-layer pressure buildup tests. Table 2 shows the estimate of the gas inflow from the four layers to be tested.

TABLE 2

Example well production log results for specific layers after 5 years of production.

| Perforation Depth (ft) | Gas Inflow* (%) | Gas Rate (Mscf/D) |
|---|---|---|
| 5278 | 0.0 | 0 |
| 5450 | 16.0 | 22 |
| 5557 | 11.0 | 15 |
| 5700 | 4.0 | 5 |

*Layer gas rate relative to well total.

Based on pre-fracture fracture-injection/falloff testing, reservoir quality varies significantly, and when attempting to identify ineffectively stimulated or inadvertently bypassed layers, a production log without other diagnostics or modeling will give ambiguous results. For example, based purely on low gas inflow, the layers at 5,278 ft and 5,700 ft might be considered the refracture-candidate layers, but the microseismic data confirms the layer at 5,700 was stimulated and the pre-fracture testing suggests the layer has very low permeability. Thus, planning on refracturing the layer perforated at 5,700 ft based on production log data alone would not improve well productivity and would not be cost effective. Gas inflow, in the absence of other diagnostics or modeling, cannot reliably determine stimulation effectiveness.

Figure 6:
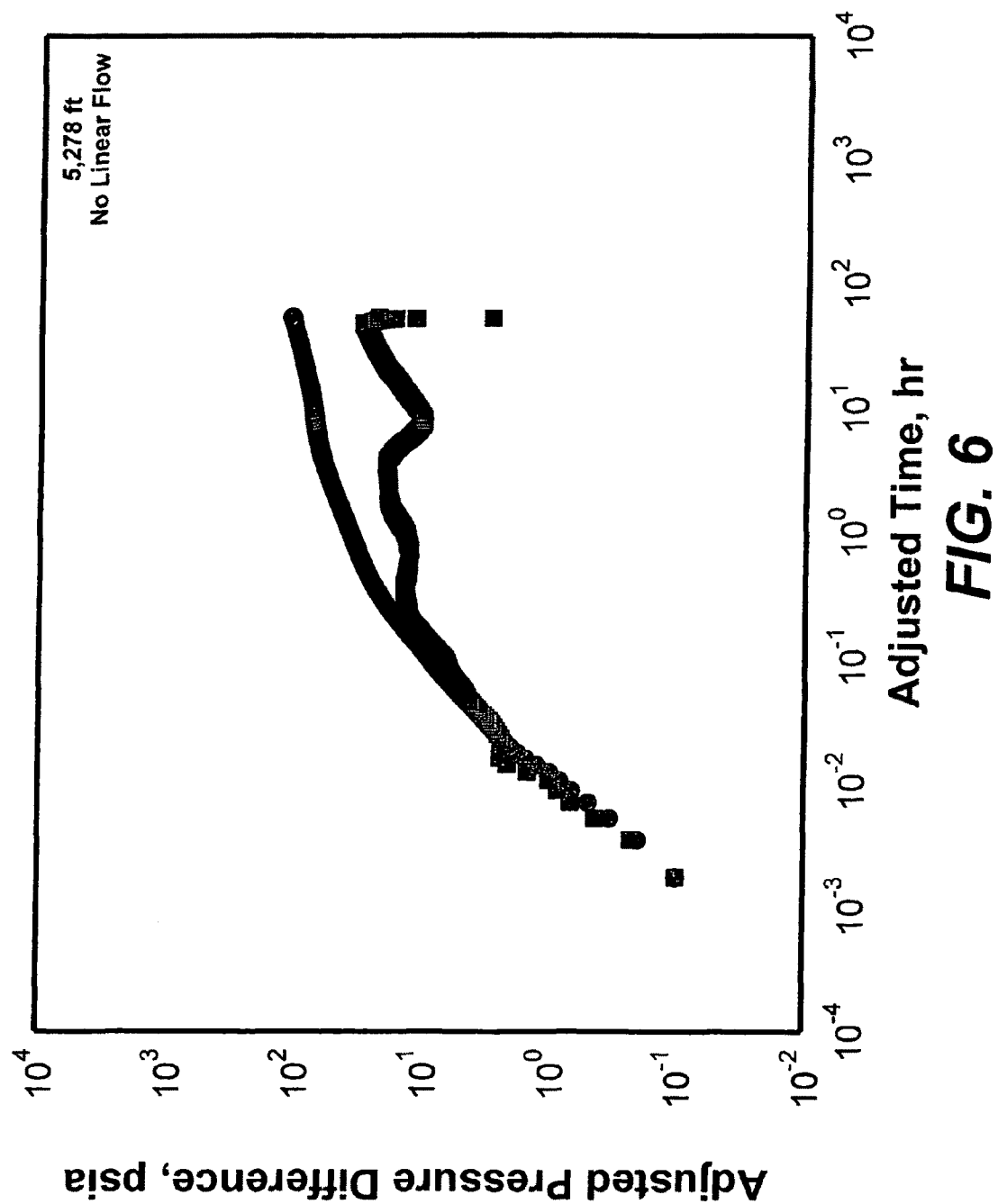
FIG. 6 shows an example of the isolated-layer pressure buildup in the perforated sand at a specific depth in an example well.

Pressure-Buildup Tests. Two analyzable data sets were recovered from the sand perforated at 5,700 ft and the sand perforated at 5,278 ft. The microseismic maps shown in FIGS. 2 and 3 suggest that the sand perforated at 5,700 ft was stimulated while the sand perforated at 5,278 ft was bypassed. Careful inspection of FIG. 3 shows that microseismic events appeared to grow down from the perforations at 5,165 ft, and mapped about 550 ft from the wellbore in what might be a correlative sand. FIG. 6 shows a log-log graph of adjusted pseudopressure difference vs. adjusted equivalent time for the buildup in the sand perforated at 5,278 ft. No linear flow was observed, but the data also do not match a radial flow type curve. A finite-conductivity fractured-well type curve match was required and indicated that the layer is producing from a short fracture with a fracture half-length of 80 ft, $C_r$=13.9, and an average reservoir pressure of 490 psia. The match was obtained by fixing the permeability based on the results of the pre-fracture diagnostic fracture-injection/falloff test.

Figure 7:
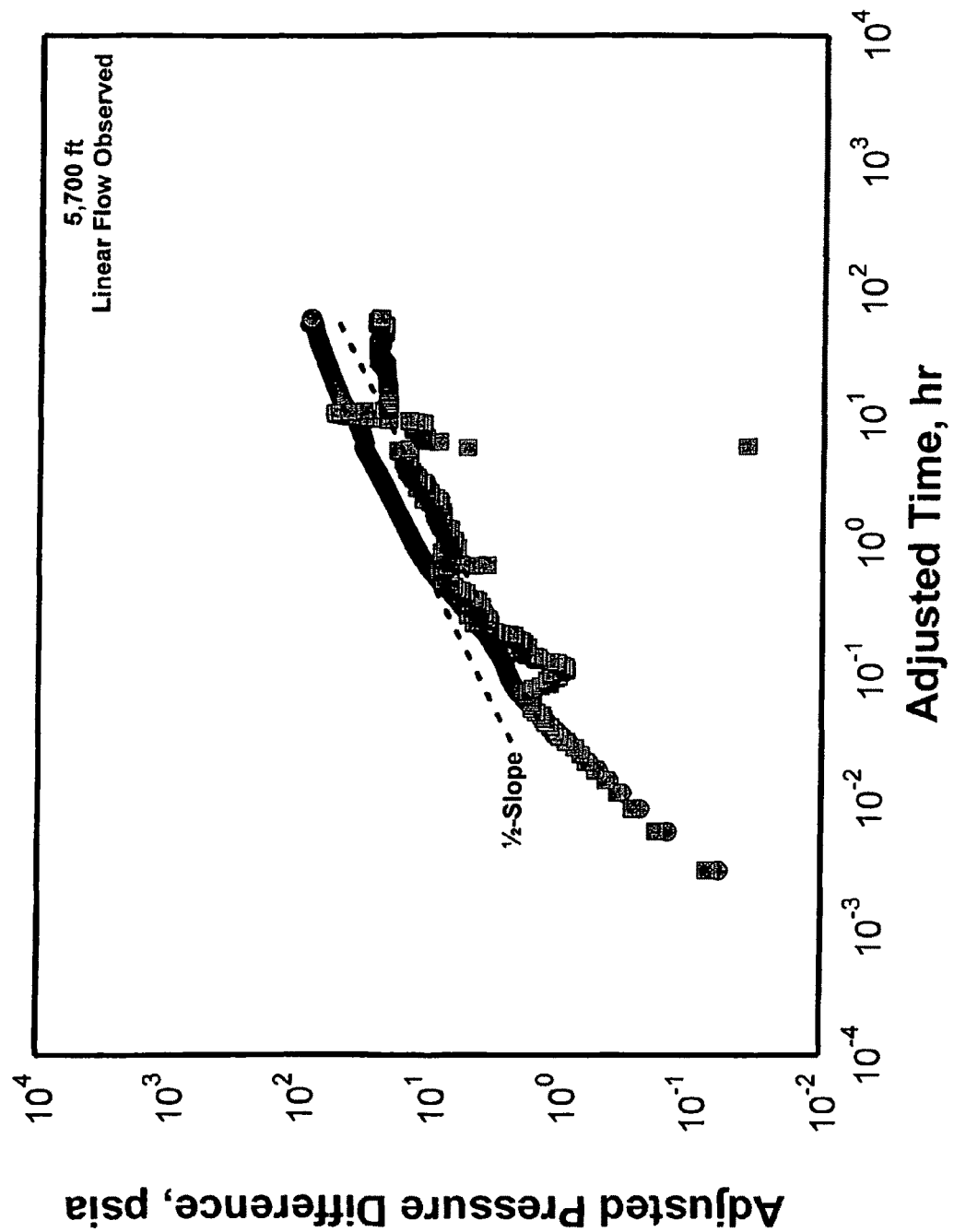
FIG. 7 shows example graphs of the isolated-layer pressure buildup in the perforated sand at a specific depth in an example well.
Figure 8A:
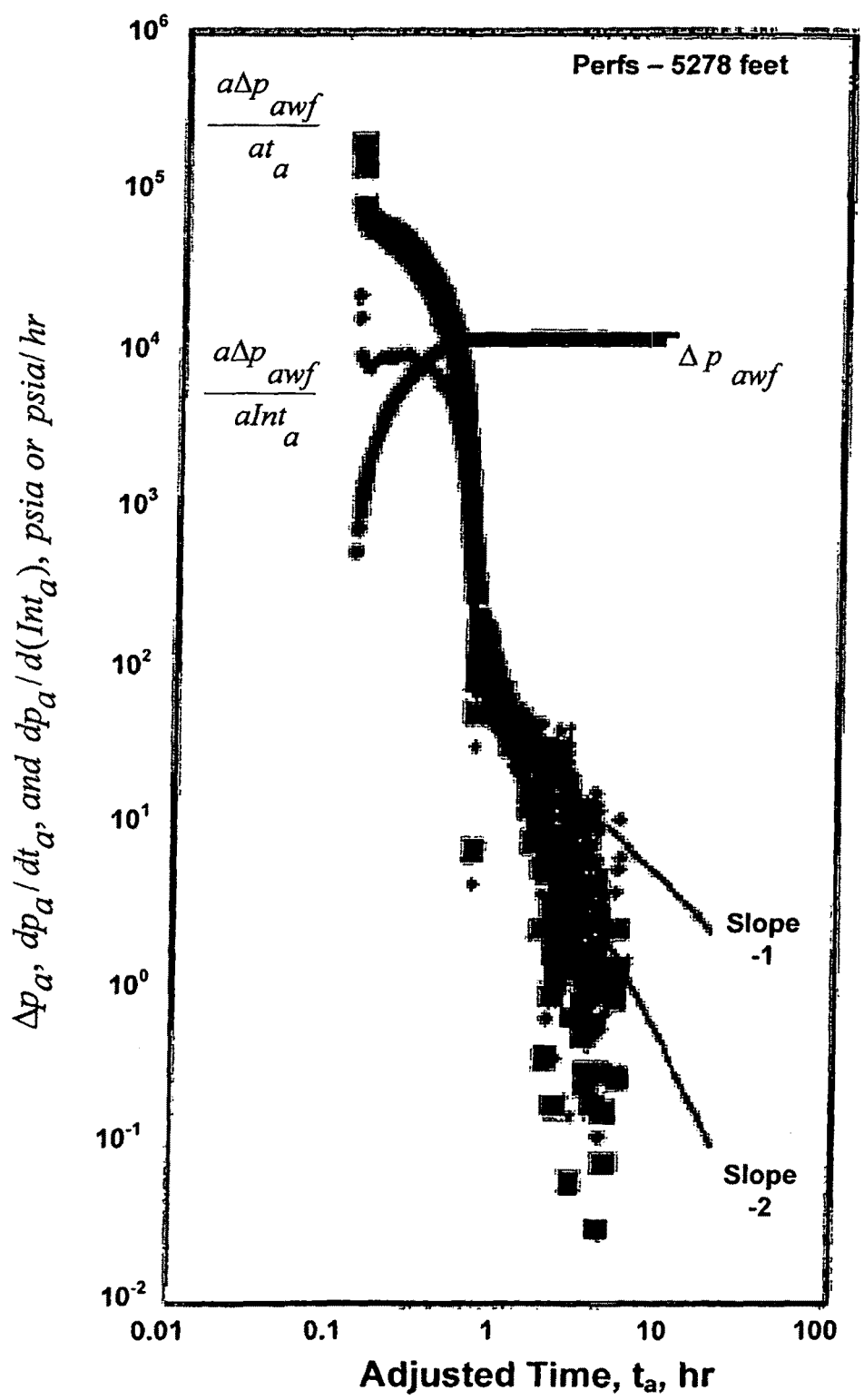
FIG. 8A shows refracture-candidate nitrogen/falloff diagnostic graphs for an example well.
Figure 8B:
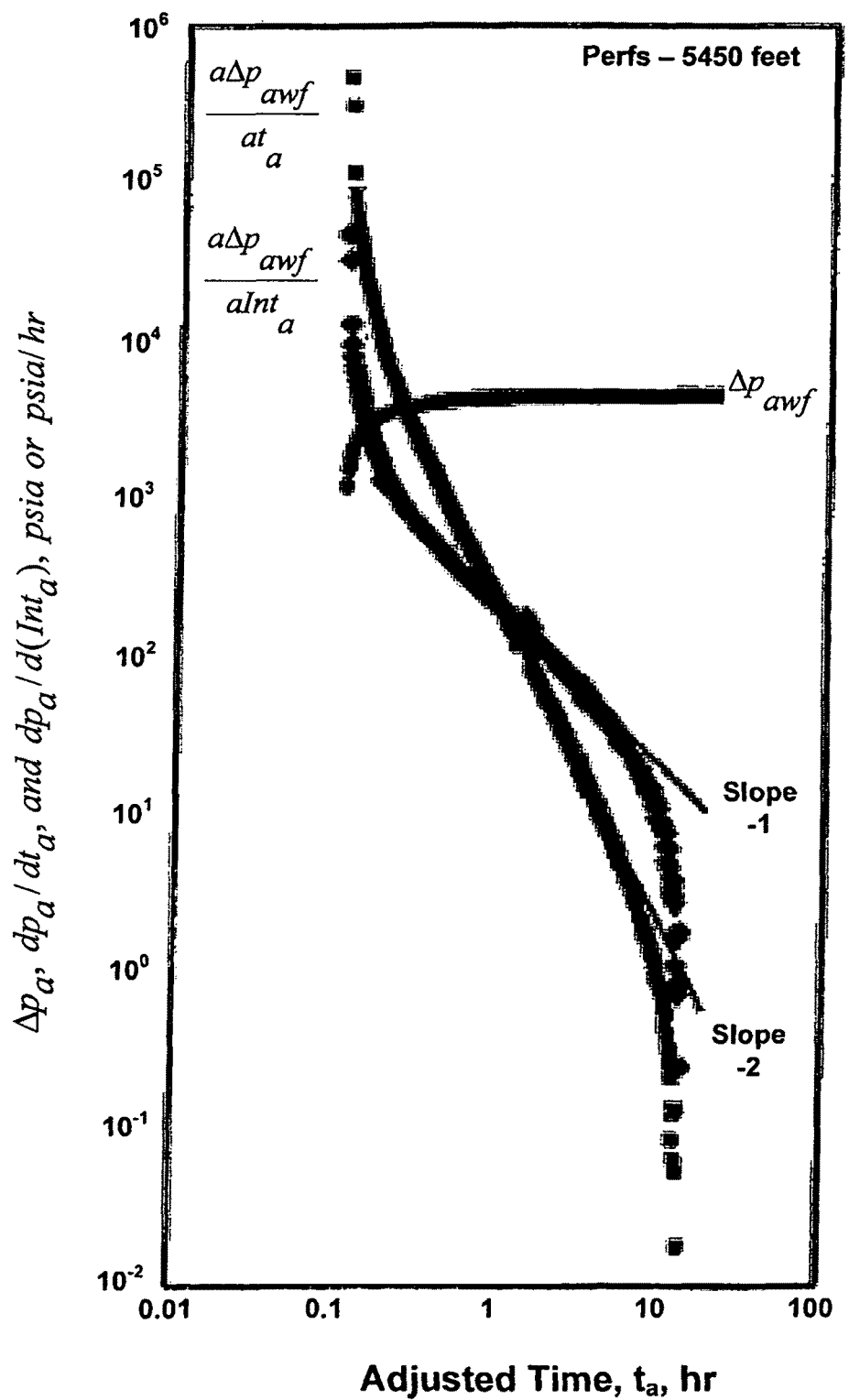
FIG. 8B shows refracture-candidate nitrogen/falloff diagnostic graphs for an example well.
Figure 8C:
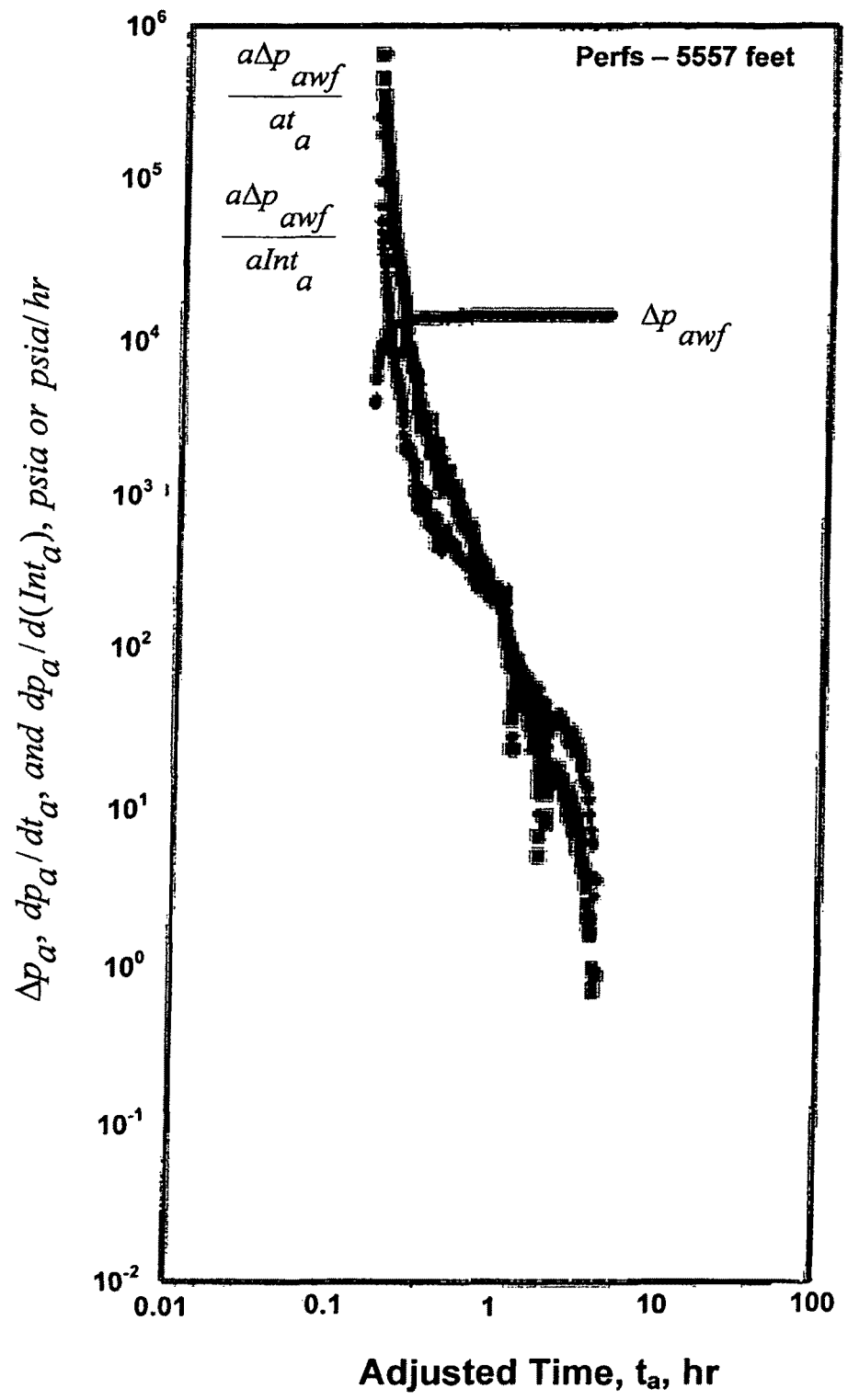
FIG. 8C shows refracture-candidate nitrogen/falloff diagnostic graphs for an example well.
Figure 8D:
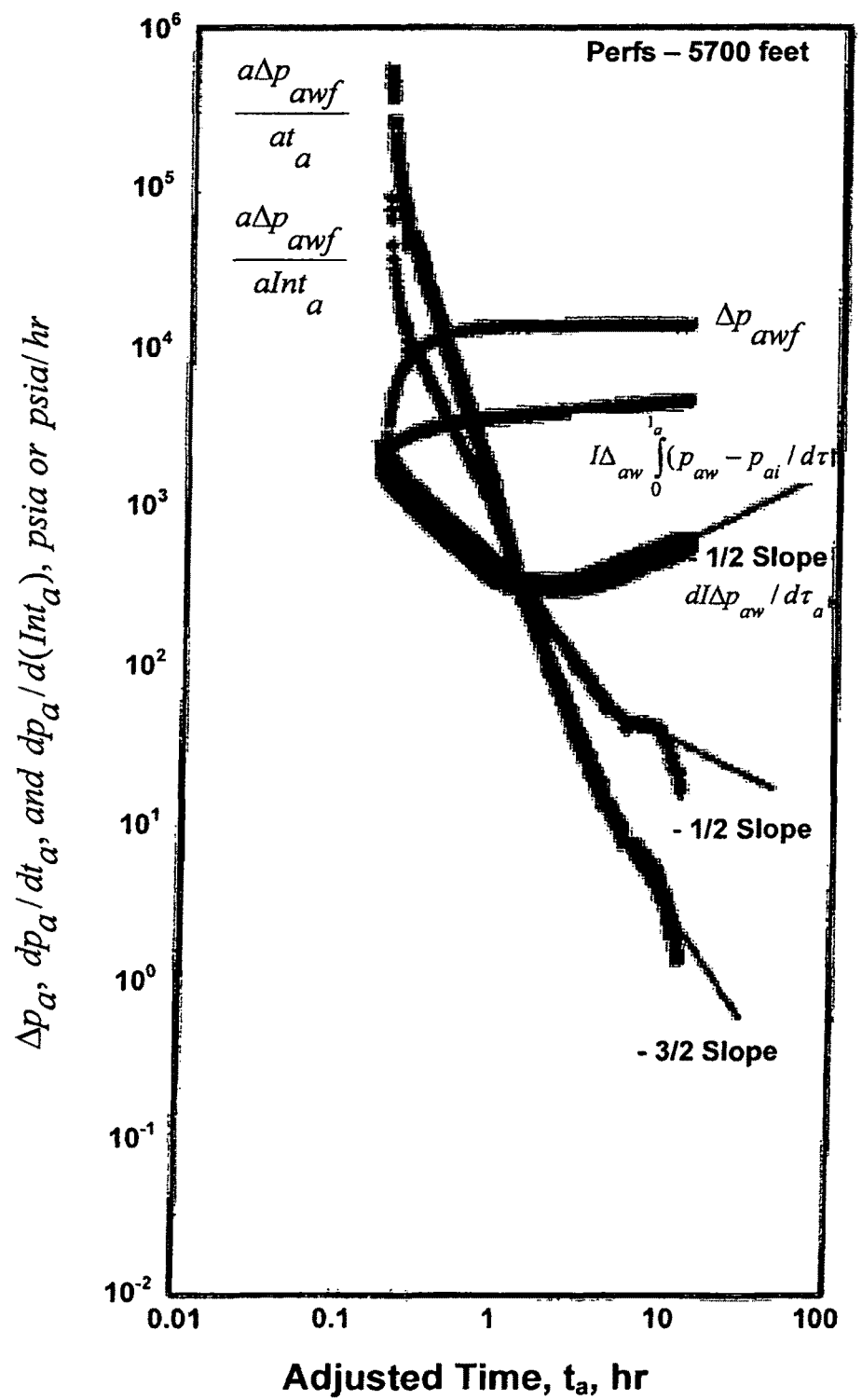
FIG. 8D shows refracture-candidate nitrogen/falloff diagnostic graphs for an example well.

FIG. 7 shows a log-log graph of adjusted pseudopressure difference vs. adjusted equivalent time for the buildup in the sand perforated at 5,700 ft, and linear flow was observed. Since fracture closure was not observed during the pre-fracture fracture-injection/falloff test, the permeability estimate is questionable. Consequently, the post-fracture pressure buildup analysis is highly non-unique; however, all matches indicated a long hydraulic fracture with greater than 200 ft of fracture half-length.

Nitrogen Fracture-Injection/Falloff Tests. A refracture-candidate diagnostic that required a fracture-injection/falloff sequence was presented in Craig, D. P. and Blasingame, T. A., *A New Refracture-Candidate Diagnostic Test Determines Reservoir Properties and Identifies Existing Conductive or Damaged Fractures*, SPE 96785 (2005). Ideally, the presence of a conductive hydraulic fracture can be interpreted from the variable storage behavior observed at hydraulic fracture closure, and a complete quantitative analysis of fracture and reservoir properties is possible when sufficient falloff data are recorded. In the example well, nitrogen fracture-injection/falloff tests were obtained in each isolated interval without the difficulties experienced during the isolated-layer pressure buildup tests. Each nitrogen fracture-injection/falloff sequence injected approximately 70,000 scf of nitrogen at 14,000 scf/min, and falloffs were recorded for 24 to 48 hours.

FIG. 8 shows log-log graphs of $\Delta p_{awf}$ vs. $t_a$, $d\Delta p_{awf}/dt_a$ vs. $t_a$, and $d\Delta p_{awf}/d(\ln t_a)$ vs. $t_a$, as disclosed in Barree, R. D., et al., *Holistic Fracture Diagnostics*, SPE 107877 (2007) for each nitrogen fracture-injection/falloff sequence. In each case, the early time data is distorted because the injection is not instantaneous. As the falloff progresses, flow regimes can be identified and specialized analysis can be completed for data in specific flow regimes. For example, the falloff data for the injections in the layer perforated at 5,278 ft and 5,450 ft both appear to transition to radial flow relatively quickly. A quick transition to radial flow indicates that the layers were not effectively stimulated, and confirms the microseismic maps shown in FIGS. 2 and 3 that suggested the layers were inadvertently bypassed. The falloff data for the injection in the layer perforated at 5,557 ft is ambiguous in that the slope(s) of the data does not match those for bilinear, linear or radial flow. Finally, the layer perforated at 5,700 ft shows a slow transition to linear flow. However, finding the portion of the data in linear flow requires calculating the derivative if the rate were constant, $t_a(p_{aw}-p_{ai})$, which falls along a positive ½ slope during linear flow. Since linear flow requires a long, essentially infinite-conductivity fracture, the layer perforated at 5,700 ft is effectively stimulated.

The pore pressure estimates from the nitrogen fracture-injection/falloff tests for each layer range from 465 psia to 515 psia, which means that all layers are being depleted. In the case of the layer perforated at 5,450 ft, the diagnostics confirm that the layer does not have a conductive hydraulic fracture, but, with 1.0 md permeability and with the layer producing 16% of the well's total production over 5 years, the reservoir pressure has declined to 500 psia. Similarly, the layer perforated at 5,278 ft does not appear to have an effective hydraulic fracture at the wellbore, but the estimated reservoir pressure is 485 psia. Thus, the reservoir is being drained. As shown in FIG. 3, microseismic events were mapped about 550 ft from the wellbore, but growing down from the layer perforated at 5,165 ft. So, it is possible that the layer is being drained by offset wells.

Refracture Design & Optimization. Nitrogen fracture-injection/falloff tests confirmed that two layers were not effectively stimulated, but the diagnostics also demonstrated that refracture treatments were not justified because the sands were being drained. Similarly, nitrogen fracture-injection/falloff tests showed that the layer perforated at 5,700 ft was effectively stimulated, and, although the flow regime identification was ambiguous for the layer perforated at 5,557 ft, the pressure had declined to 465 psia. Thus, the layer was being drained and refracturing was not deemed necessary.

Therefore, the present invention is well adapted to attain the ends and advantages mentioned as well as those that are inherent therein. While numerous changes may be made by those skilled in the art, such changes are encompassed within the spirit of this invention as defined by the appended claims. The terms in the claims have their plain, ordinary meaning unless otherwise explicitly and clearly defined by the patentee.

What is claimed is:

1. A method for selecting well candidate layers for stimulation treatments in a subterranean formation comprising the steps of:
    selecting a candidate well;
    selecting a reservoir layer to be tested;
    performing a quantitative refracture-candidate diagnostic test on the reservoir layer wherein the quantitative refracture-candidate diagnostic test comprises the following steps:
        isolating the reservoir layer to be tested;
        introducing an injection fluid into the reservoir layer at a pressure that exceeds the fracture pressure for that layer;
        shutting in the well bore surrounding the reservoir layer and measuring pressure in the reservoir layer during the shut in period; and,
        quantitatively determining at least one reservoir property of the reservoir layer using the quantitative refracture-candidate diagnostic test;
    modeling a proposed stimulation treatment using the at least one reservoir property in a reservoir simulation model so as to predict an efficacy of the proposed stimulation treatment; and,
    outputting the predicted efficacy.

2. The method of claim 1 wherein the proposed stimulation treatment comprises a fracturing treatment.

3. The method of claim 1 further comprising determining a closure stress of the reservoir layer.

4. The method of claim 1 further comprising determining a pre-existing fracture half-length and a pre-existing fracture conductivity.

5. The method of claim 3 further comprising determining a pre-existing fracture half-length and a pre-existing fracture conductivity.

6. A method for selecting well candidate layers for stimulation treatments in a subterranean formation comprising the steps of:
    selecting a candidate well;
    selecting a reservoir layer to be tested;
    performing a quantitative refracture-candidate diagnostic test on the reservoir layer wherein the quantitative refracture-candidate diagnostic test comprises the following steps:
        isolating the reservoir layer to be tested;
        introducing an injection fluid into the reservoir layer at a pressure that exceeds the fracture pressure for that layer;
        shutting in the well bore surrounding the reservoir layer and measuring pressure in the reservoir layer during the shut in period; and,
        quantitatively determining at least one reservoir property of the reservoir layer using a fracture-injection/falloff test;
    modeling a proposed stimulation treatment using the at least one reservoir property in a reservoir simulation model so as to predict an efficacy of the proposed stimulation treatment; and,
    outputting the predicted efficacy.

7. The method of claim 6 wherein the proposed stimulation treatment comprises a fracturing treatment.

8. The method of claim 6 further comprising determining a closure stress of the reservoir layer.

9. The method of claim 6 further comprising determining a pre-existing fracture half-length and a pre-existing fracture conductivity.

10. The method of claim 8 further comprising determining a pre-existing fracture half-length and a pre-existing fracture conductivity.

11. A computer program, stored on a tangible storage medium, for evaluating refracture efficacy of at least one reservoir layer in a subterranean formation, the program comprising executable instructions that cause a computer to:
    determine at least one reservoir property of the reservoir layer using a quantitative refracture-candidate diagnostic model wherein the quantitative refracture-candidate diagnostic model uses data collected from the following steps:
        isolating the reservoir layer to be tested;
        introducing an injection fluid into the reservoir layer at a pressure that exceeds the fracture pressure for that layer;
        shutting in the well bore surrounding the reservoir layer and measuring pressure in the reservoir layer during the shut in period; and,
    modeling a proposed stimulation treatment using the at least one reservoir property in a reservoir simulation model so as to predict an efficacy of the proposed stimulation treatment.

12. The computer program of claim 11 wherein the at least one reservoir property comprises a quantitatively determined reservoir transmissibility of the reservoir layer.

13. The method of claim 11 wherein the proposed stimulation treatment comprises a fracturing treatment.

14. The method of claim 12 further comprising determining a closure stress of the reservoir layer.

15. The method of claim 12 further comprising determining a pre-existing fracture half-length and a pre-existing fracture conductivity.

16. The method of claim 14 further comprising determining a pre-existing fracture half-length and a pre-existing fracture conductivity.

* * * * *